(12) United States Patent
Shields et al.

(10) Patent No.: US 6,885,023 B2
(45) Date of Patent: Apr. 26, 2005

(54) OPTICAL DEVICE AND A METHOD OF MAKING AN OPTICAL DEVICE

(75) Inventors: Andrew James Shields, Cambridge (GB); Nalin Kumar Patel, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/333,972

(22) PCT Filed: Jul. 27, 2001

(86) PCT No.: PCT/GB01/03411

§ 371 (c)(1),
(2), (4) Date: Jul. 10, 2003

(87) PCT Pub. No.: WO02/11211

PCT Pub. Date: Feb. 7, 2002

(65) Prior Publication Data

US 2004/0021138 A1 Feb. 5, 2004

(30) Foreign Application Priority Data

Jul. 28, 2000 (GB) .............................. 0018751

(51) Int. Cl.[7] ......................................... H01L 31/0304
(52) U.S. Cl. .............................. 257/21; 257/17; 257/23
(58) Field of Search ............................. 257/21, 17, 23

(56) References Cited

U.S. PATENT DOCUMENTS 5,266,814 A   11/1993   Inata et al.
5,939,729 A * 8/1999   Chu et al. ................... 257/25

FOREIGN PATENT DOCUMENTS

| GB | 2 303 246 | 2/1997 |
| GB | 2 341 722 | 3/2000 |
| GB | 2 352 087 | 1/2001 |
| GB | 2 353 635 | 2/2001 |

OTHER PUBLICATIONS

A. Patane, et al., Journal of Applied Physics, vol. 88, No. 4, pp. 2005–2012, "Resonant Tunneling and Photoluminescence Spectroscopy in Quantum Wells Containing Self–Assembled Quantum Dots", Aug. 15, 2000.

J. L. Jimenez, et al., Applied Physics Letters, vol. 71, No. 24, pp. 3558–3560, "The Quantum Dot Spectrometer", Dec. 15, 1997.

T. Nakano, et al., Japan Journal of Applied Physics, vol. 36, Part 1, No. 7A, pp. 4283–4288, "A Novel Bistable Double–Barrier Resonant Tunnel Diode by Charging Effect of InAs Dots", Jul. 15, 1997.

* cited by examiner

*Primary Examiner*—Jerome Jackson
(74) *Attorney, Agent, or Firm*—Oblon, Spivak, McClelland, Maier & Neustadt, P.C.

(57) ABSTRACT

An optical device such as a radiation detector or an optically activated memory includes a barrier region located between two active regions. One or more quantum dots are provided such that a change in the charging state of the quantum dot or dots affects the flow of current through the barrier region. The charging states of the quantum dot is changed by an optical device.

36 Claims, 21 Drawing Sheets

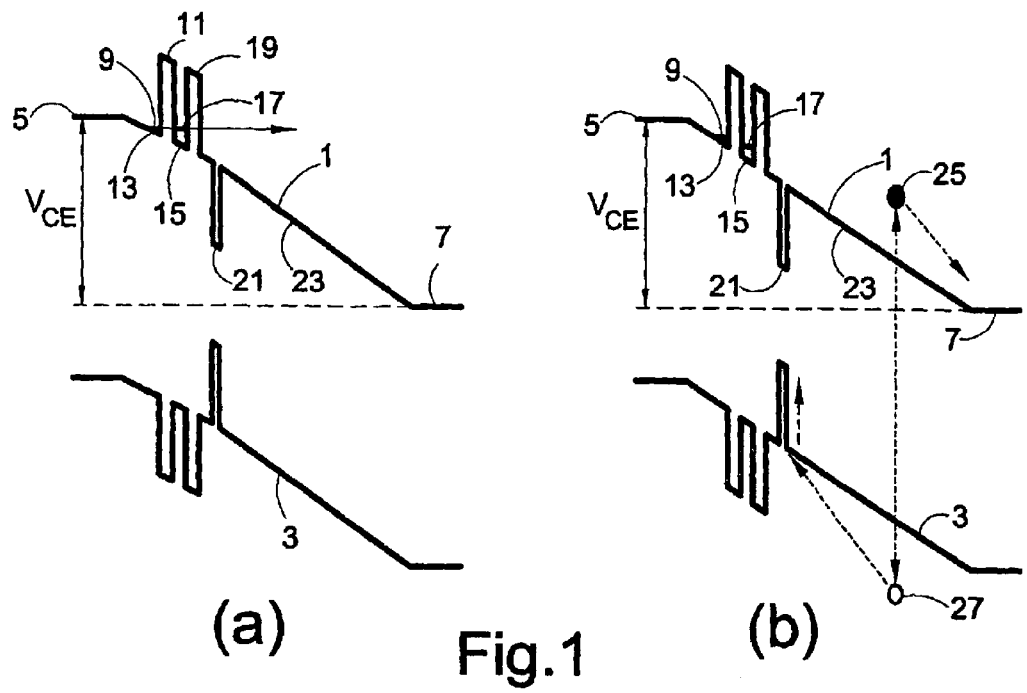
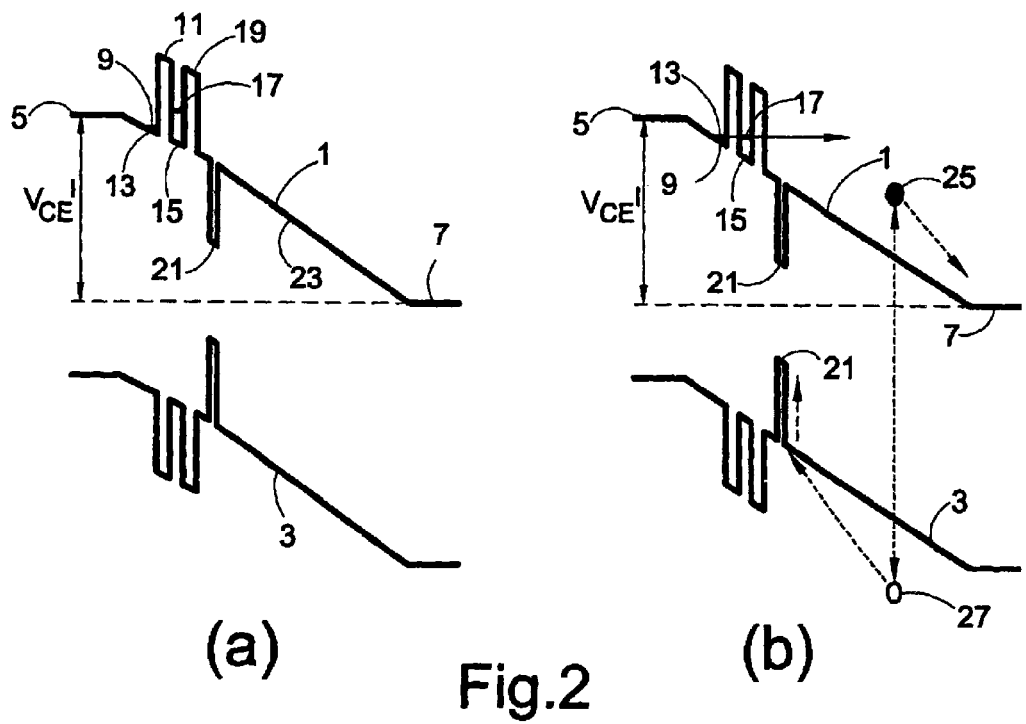

OPTICAL DEVICE AND A METHOD OF MAKING AN OPTICAL DEVICE

BACKGROUND OF THE INVENTION

1. Field of the Invention

The present invention relates to the field of optical devices such as photon detectors and optical memory structures. More specifically, the present invention relates to photon detectors which may be configured to detect single photons and also on optically programmable non-volatile memory.

2. Discussion of the Background

There is a need for an optical detector which is capable of detecting a single photon. Recently, this need has been heightened by the advent of quantum cryptography of optical signals. In essence, quantum cryptography relies upon the transmission of data bits as single particles, in this case, photons, which are indivisible. One way in which the data can be encoded is via the polarisation of the electric field vector of the photons. The key component of such a system is a detector which can respond to individual photons. It has been proposed that quantum cryptography can be used to transmit the key for the encryption of data.

Single photon detection is also useful as a low level light detection means for spectroscopy, medical imaging or astronomy. An optimum signal to noise ratio is achieved when a single photon is detected, as the noise is then limited by the shot noise and is independent of noise arising due to the detector amplifier.

A single photon detector could also be used for time-of-flight ranging experiments where the distance-of an object from a fixed point is measured by calculating the time over which a single photon takes to return to a detector. This technique can also be used to scan the surface of an object, even a distant object, to form a spatial image of its surface depth, thickness etc.

Single photon detectors are available in the form of photo multiplier tubes (PMT) and single photon avalanche photo diodes (SPAD). PMTs have the disadvantage of having low quantum efficiency, being expensive, bulky, mechanically fragile, requiring high biasing voltages and cooling. They can also be damaged and can require a long settling time after exposure to high light levels or stray magnetic fields. On the other hand, SPADs have the disadvantage of having a relatively low gain and high dark count rates, especially when operated at higher repetition rates. They are also expensive and require high bias voltages and external cooling.

SUMMARY OF THE INVENTION

The present invention addresses the above problems of SPADs and PMTs and can operate using low voltages (less than 5V). It is also suitable for fabrication into a multi-channel array of detectors, which is useful for spatial imaging and spectroscopy. It also has a fast time response and less noise, thus it can be used to measure the time of the arrival of the photon.

The detector of the present invention is completely different to those described above and uses optically stored charge to affect the tunnelling characteristics of a device.

Previously, Nakano et al, in Jpn. J Appl Physics, 36 p4283 to 4288 (1997) have designed a purely electrical device to demonstrate that charged trapped in a layer of quantum dots can have on the resonant tunnelling characteristics of a device. This study used biases as opposed to light to cause a change in the charging state of the quantum dots. The device worked at 300K.

In a first aspect, the present invention provides an optical device comprising: a barrier region provided between first and second active regions, wherein the tunnelling of carriers can occur from the first region to the second region through the barrier region, a first quantum dot being provided such that a change in the charging state of the quantum dot causes a change in the conditions for tunnelling through the barrier region, and means to change the charging state of said first quantum dot in response to irradiation.

Either or both of the first or second active regions can be bulk regions, where the carriers in those regions occupy to a continuum of energy levels. However, the device may also be a "low dimensional" structure where the energy of the carriers is quantised such that the carrier can only occupy one or more discreet energy levels. Confinement of the carriers in one or more dimensions modifies this energy spectrum by a quantisation of the k-vector along the confinement direction(s). In a quantum dot, the motion of the carriers is restricted in all three spatial dimensions. Consequently, the energy spectrum of the dots consists of a series of discrete levels. As the size of the quantum dot reduces, the energy spacing between these discrete levels increases. The maximum number of electrons which can occupy each electron level is two, corresponding to the up and down spin states. Similarly, each hole level has an occupancy of two.

In a preferred device, the first active region is configured to allow the flow of carriers therethrough at a first energy level, the second layer is configured to allow the flow of carriers therethrough at a second energy level, and a change in the charging state of the quantum dot causes a change in the relative energies of the first and second energy levels.

The change in the relative energies of the energy levels affects the tunnelling conditions. However, the tunnelling current through the barrier region will be affected to a greater or lesser degree depending on the actual configuration of the device. Preferably, the device is configured such that the first and second energy levels are capable of being aligned. When the first and second energy levels are aligned, resonant tunnelling can occur through the barrier layer. Under such a resonant tunnelling condition, a relatively large tunnel current will flow compared to the non-resonant case. The device is therefore preferably configured such that a change in the charging state of the quantum dot causes-the device to be switched from being off resonance (i.e. levels not aligned) or "on resonance" (i.e. levels aligned) or vice versa.

Generally, the device will take the form of a resonant tunnelling diode comprising an emitter and collector located on either side of the barrier region. The detector can be configured such that carriers flow from the emitter to the collector when the first and second energy levels are aligned.

Therefore, a relatively large change in the tunnel current can be observed due to the absorption of a single photon. Of course, the device is not limited to just detecting single photons and can also be used to detect a plurality of photons.

The device can be configured as a photon detector or an optically activated memory. Preferably, for a photon detector, the device is configured such that the layers are not aligned i.e. the device is "off-resonance" prior to illumination.

In this arrangement, the energy levels are aligned upon illumination. Under certain operating conditions, it is believed that the flow of charge due to resonant tunnelling (i.e. when the levels are aligned in energy) will re-set the charge in the dot and return the device to its "off-resonance" state. Thus, the detector resets itself.

In the resonant tunnelling diode configuration which comprises a collector and an emitter, a bias is applied across the collector and emitter in order to cause charge to flow from the emitter to the collector. This bias will also affect the alignment of the first and second energy levels. Therefore, the relative energies of the first and second energy levels can be controlled by the application of an appropriate emitter-collector bias.

The collector and emitter may comprise metal layers. Alternatively, at least one of the collector and/or emitter may comprise a heavily doped semiconductor layer. The collector and emitter may have the same polarity or may have opposing polarities. The collector and/or emitter may form part of the first and/or second active regions. Preferably, at least one of the collector and emitter is transparent to radiation such that radiation can enter the device through the collector and/or emitter.

The electron-hole pair which is generated due to incident radiation can be generated in an absorption region of the device. In this configuration, means are required to separate the electron-hole pair generated in the absorption region and to sweep at least one of said electron or hole into the quantum dot.

In an alternative configuration, the device can be configured such that radiation excites carriers in the first quantum dot. Either interband transitions i.e. where an electron-hole pair is generated or intraband transitions where an electron or hole is excited to a further energy level can be excited. Means can be provided to sweep a photo-excited carrier or photo-excited carriers out of the first quantum dot to change its charging state.

In this configuration, radiation of only certain wavelengths (dependent on the characteristics of the device) will be able to change the charging state of the dot. Intraband transitions which can be excited within the dot often occur in the mid or far infrared part of the spectrum.

The means for sweeping carriers either to or from the first quantum dot can comprise a means to apply a DC bias across the device, for example, electrodes may be provided on either side of the quantum dot. Alternatively, these means may comprise a Schottky gate. Where a DC bias is applied across the device in order to separate the electron-hole pair, these electrodes may be the same as the emitter and collector used to create current flow through the device. Preferably, these means are transparent to the incident radiation.

The first and second active regions may be single layers, parts of single layers or a plurality of layers. There is no requirement for the first and second active layers to be the same. Also, it should be noted that the first quantum dot may lie directly in line with the tunnel current or it may lie to the side of the region through which the tunnel current passes.

At least one, or preferably both of the first and second active regions are configured to be able to support low dimensional confinement of carriers in order to allow tunnelling therethrough. Preferably, the first active region will be capable of supporting two dimensional carrier confinement on one side of the tunnel barrier. Alternatively, the first active region may comprise a quantum dot, such that confinement caused by the quantum dot provides the first energy level.

The second active region may be configured to support a two dimensional confinement region or even zero-dimensional confinement (a quantum dot) to supply the second energy level. In order to form the second active region, a second barrier region is preferably provided on the opposing side of the second active region to the first barrier region.

The second barrier region is preferably configured such that alignment of the two energy levels will cause resonant tunnelling through both of the barrier regions.

Although the previous discussion has concentrated on a resonant tunnelling device, any change in the tunnelling conditions, e.g. a change in the alignment of the first and second energy levels will result in a change in the tunnel current which can be measured. However, the resonant tunnelling device is the preferred device as a large change in the tunnel current as the device is switched from on-resonance or off-resonance will be seen.

As previously described, the detector may comprise an absorption region configured to absorb incident radiation. Preferably, this region is configured to absorb at least 50% of the incident radiation, more preferably at least 70%, even more preferably at least 90% of the incident radiation.

The rate of absorption absorbed by an absorption region of thickness L is given by the formula $R=R_o[1-\exp(-\alpha L)]$, where $R_o$ is the rate of incident photons and $\alpha$ is the absorption coefficient. The absorption coefficient $\alpha$ depends upon the material and the wavelength of the incident radiation. For example, for GaAs having a thickness of 800 nm, $\alpha=1.5\times10^6$ m$^{-1}$. Thus, a 2 nm layer would absorb 0.3% of the incident lights and a 1 µm thick GaAs layer will absorb 78% of the incident light. The absorption region may be provided on an opposing side of the second active layer to the first active layer.

Preferably, the device is configured so that the quantum dot traps a hole. However, it will be appreciated by those skilled in the art that the device would also work if the quantum dot was configured to trap a photo-excited electron. The trapped photo electric charge trapped in the dot can have the same polarity or a different polarity to that of the tunnel current.

The quantum dot must be located so that charging of the quantum dot can affect the relative separation of the two energy levels. The quantum dot may be provided on either side of or anywhere surrounding the first region, tunnel region, second region arrangement or within any of these regions. Preferably, the first quantum dot is formed within the absorption layer. Alternatively, the quantum dot layer may be provided in either of the first and/or second barrier regions or within either of the active layers.

It has been previously mentioned that either of the first and second active regions could comprise quantum dots to define either or both of the first and second energy levels such that tunnelling occurs through a quantum dot in either or both of the first and second active regions. In this arrangement, either the quantum dot used to the first energy level, the 'first active dot' or the quantum dot used to define the second energy level, the 'second active dot', can also function to store charge in the same manner as the first quantum dot as well as allowing tunnelling. Therefore, in this arrangement, the first quantum dot is combined with one of the active regions.

Preferably a plurality of first quantum dots is provided. A plurality of layers or quantum dots, where each layer comprises a plurality of first quantum dots may also be provided. The plurality of first quantum dots may be of different sizes. When the dots are of different sizes or compositions, they can absorb radiation of different wavelengths. This is particularly useful when the device is configured such that the dot itself absorbs incident radiation.

In the preferred arrangement, the first barrier region will be a first barrier layer and the device will be configured in a layer by layer arrangement such that tunnelling occurs substantially perpendicular to the plane of the barrier layer.

However, a lateral tunnelling device is also possible, where tunnelling takes place substantially within or parallel to a plane of a layer of the device. Such a tunnelling device could comprise a first active region provided by a first quantum dot, a second active region provided by a second quantum dot where the tunnelling characteristics of the first and second quantum dots are affected by the charging state of a third quantum dot provided in the vicinity of the first and second quantum dots.

The present invention can be configured as a single photon detector. In order to efficiently detect single photons, it is preferable if the active area of the device, i.e. the area through which tunnelling occurs, is less than $10^{-10}$ m$^2$. More preferably, this active area is at most $10^{-11}$ m$^2$. A single photon detector preferably comprises at most 1000 first quantum dots and more preferably at most 100 first quantum dots.

Preferably, an anti-reflection coating is provided on the surface of the detector which receives the incident radiation. The detector may be provided in a resonant cavity in order to reflect any unabsorbed incident light back into the detector.

In order for the detector to efficiently detect light, it is preferable if any electrodes provided on the surface of the device which is incident to the radiation are essentially transparent.

A particularly useful example of the device is provided by a $In_yAl_{1-y}As/In_xGa_{1-x}As$ system. Preferably in this system x is about 0.53 and y is about 0.52. This system allows the first and/or second active regions to be fabricated from InGaAs and a barrier region, comprising a InAlAs layer provided adjacent the first active layer. The barrier region is preferably the first barrier region. The large conduction band discontinuity between InGaAs and InAlAs potentially allows the device to operate at high temperatures. The conduction band discontinuity where x=0.53 and y=0.52 has been measured between 500 and 550 meV.

Quantum dots which are formed as first quantum dots to store charge, or dots which are used to define the first and/or second energy levels are preferably formed by depositing InAs or InGaAs.

An InGaAs absorption layer has a lower band gap than GaAs. Therefore, this absorption layer is able to absorb radiation further into the infrared region. For example, $In_{0.53}Ga_{0.47}As$ can absorb at the important wavelengths of 1.3 and 1.55 microns. These wavelengths are commonly used for fibre optic communication. In such systems, the dots will typically comprise InAs. Any Indium containing absorption layer is advantageous for example, the absorption layer could be formed from InGaAs, InGaAlAs, InGaAsSb. Another possibility is to form the absorption layer from GaAsN.

The above system can be lattice matched to an InP substrate. This will allow the growth of a $In_{0.53}Ga_{0.47}As/In_{0.52}Al_{0.48}As$ structure without lattice strain.

However, it is not mandatory to use a lattice matched substrate. For example, it is possible to form the above system on a GaAs substrate or any other substrate for that matter if means are provided for lattice matching the lattice constant of at least one of the active regions with that of the substrate. Such means may comprise a compositionally graded buffer wherein the composition of the buffer is graded such that the lattice constant of the buffer matches that of the substrate at its lower interface and that of the first active layer at its upper surface. Such a compositionally graded buffer may comprise $In_wGa_{1-w}As$ where W changes from W=0 to W=X=0.52 gradually throughout the buffer layer. This gradual change gradually alters the lattice constant from that of the substrate to that of the second active layer. Other compositionally graded buffer layers could be used, for example, $AlGaAs_xSb_{1-x}$ where x is varied.

The use of a lattice matching means such as a compositionally graded buffer allows a free choice of the indium content in the first active region. This is because the lattice constant of the compositionally graded buffer can be tuned to any desired value.

It is also possible to use a strain relaxed buffer layer, for example a quarternary such as AlGaAsSb. Again, the strain relaxed buffer layer can be used to provide any lattice constant for subsequent growth. The composition of the quarternary can be varied in order to match the lattice constant of the first active layer. However, it should be noted that the composition of the quarternary does not change in the same way as described for the compositional graded buffer layer. The strain relaxed buffer layer can accommodate dislocations.

The width of such a buffer layer is typically at least 1 $\mu$m. It is also possible to fabricate the device from a $Si/Si_{1-x}Ge_x$ system, preferably x is about 0.3.

In a second aspect, the present invention provides an optical device comprising: a barrier region provided between first and second active region wherein tunnelling of carriers can occur from the first region to the second region through the barrier region, a first quantum dot being provided such that a change in the charging state of the quantum dot causes a change in the conditions for tunnelling through the barrier region, and means to change the charging state of said first quantum dot in response to irradiation.

The optically activated means will preferably be provided by a quantum dot as previously described.

Preferably, in both detector in accordance with the first and second aspects of the present invention, the quantum dots are formed by a self assembling technique such as the Stranskii Krastanow method.

Therefore, in a third aspect, the present invention provides a method of fabricating an optical device comprising: a barrier region provided-between first and second active regions, such that tunnelling of carriers can occur from the first region to the second region through the barrier region, a first quantum dot being provided such that a change in the charging state of the quantum dot causes a change in the tunnelling conditions through the barrier region, and means to change the charging state of said first quantum dot in response to irradiation; wherein the said first quantum dot is formed as part of a layer comprising a plurality of quantum dots; the method comprising the steps of: forming at most 10 monolayers of a quantum dot layer overlying and in contact with a layer having a substantially different lattice constant to that of the quantum dot layer such that the quantum dot layer forms islands, and forming a layer overlying said quantum dot layer having a substantially different lattice constant to that of the quantum dot layer, such that a plurality of encapsulated quantum dots are formed.

The quantum dot layer may be formed in the absorption region. Therefore, the device will preferably be formed by forming a first active region, a barrier region overlying and in contact with first active region, a second active region overlying and in contact with said barrier region, a second barrier region overlying and in contact with said second active region and part of the absorption region overlying and in contact with said second active region. The quantum dot layer would then be formed overlying this part of the absorption region and then the remainder of the absorption region would be formed on top of the quantum dot layer such that the quantum dot layer is encapsulated within the absorption region.

Alternatively, the quantum dot layer could be formed in the first barrier region. In this situation, the barrier region would be formed overlying and in contact with the first active region. However, only part of the barrier region would be formed. The quantum dot layer would then be formed overlying and in contact with the partial first barrier region and the remaining part of the barrier region would be formed overlying and in contact with the quantum dot region such that the first barrier region serves to encapsulate the quantum dot layer. The second active region would be formed overlying and in contact with the first barrier region, and the second barrier region would then be formed overlying and in contact with the second active region. The absorption region, if required, will then be formed overlying and in contact with the second barrier region.

The first dot layer could also be formed in the first active region, the second active region or the second tunnel barrier region by forming a part of the region and then forming the quantum dot layer such that the quantum dot layer will be encapsulated by the relevant region.

Preferably, the structure would be etched through the layers to form a mesa. If the structure comprises an electrode such as an emitter or collector formed overlying the above mentioned layers, just the electrode could be etched to define the mesa.

The structure may comprise a lower electrode. Preferably, the etch does not extend as far as the lower electrode in order to allow contact to be made to the lower electrode.

As the mesa is preferably relatively small, if the device is configured to detect single photons, it is difficult to make direct electrical contact to an electrode on the top of the mesa. Preferably, contact metal is provided overlying the electrode and extending away from the mesa in order to make electrical contact to the mesa.

Another way to address the contact problem is to define the active area as the area of overlap between the collector and emitter. For this explanation, it will be assumed that the emitter is provided at the substrate side of the device and that the collector is provided at the end of the mesa away from the substrate. The above described regions will be formed on the emitter. Prior to formation of the layers, the emitter is etched into a plurality of isolated strips. The layers are then formed on the etched emitter and the collector is then provided overlying the layers. The collector is then etched to form a strip or plurality of strips which cross the emitter. The area or areas of overlap of the emitter and collector define the active area of the device. As both the detector and emitter extend away from the active area, electrical contact can easily be made to both the emitter and collector.

The optical devices of the first and second aspects of the present invention can also be used to fabricate a photon detector array. This comprises a plurality of elements, each element comprising an optical device as previously hereinbefore described configured as a photon detector. The elements may form a one dimensional array. For example, the elements may be elongate and arranged substantially parallel to one another. This arrangement is useful for a grating spectrometer where light can be dispersed in wavelength along a direction perpendicular to the elongate elements. In this arrangement each element will detect a different wavelength.

The photon detector array may be a 2D array provided with a grid of bit-lines and word-lines where each element is addressable by applying appropriate voltage to a word-line and/or bit-line. Preferably, the bit-lines and word-lines are configured to apply a control signal to the means for changing the charging state of the quantum dot or the optically activated means to vary the relative energies of the first and second energy levels.

The array may be fabricated such that the word line is configured to apply a potential to the collector and the bit line is configured to apply a potential to the emitter or vice versa.

In a preferable configuration for a two dimensional photon detector array, the array will be configured such that elements in the desired detection area are in an active state. An active state means that the device is configured such that upon illumination with radiation of an appropriate wavelength, the device is configured such that the tunnelling conditions will be changed. The plurality of bit-lines and word-lines are provided with current sensors such that a change in the tunnelling conditions (due to photo absorption) of an element will cause a change in the measured current on both the word-line and bit-line to which the element is connected. Thus, the exact element which absorbs radiation can be determined.

The present invention also lends itself to a memory device and specifically a programmable non-volatile memory (PROM).

The memory essentially consists of a photon detector array as previously described. The photon array comprises a plurality of elements where each element comprises a photon detector as described above. Each photon detector can act as a memory element.

The array is preferably arranged as a grid of bit-lines and word-lines where each pixel is addressable by applying an appropriate voltage to a word-line and/or bit-line. Although, a one dimensional array is also possible.

For a write operation, the pixels which are to be written to are addressed by applying an appropriate voltage to the bit-lines and word-lines. The voltage is applied so that upon illumination, photo-excited carriers are swept into or out of the dot to change the charging state of the first quantum dot.

An appropriate bias is not applied to the unselected pixels. Photo-excited carriers will be excited in the non selected pixels. However, the photo-excited carriers will not be swept into or out of the first quantum dot and as a result, the charging state of the first quantum dot will not change.

For example, if the first and second energy levels are aligned, then the detector is 'on-resonance' and can be thought of as having a logic state of '1'. If the detector is off resonance (i.e. levels misaligned), the detector can be thought of as having a logic state of '0'. Whether or not the detector or memory element is on or off resonance can then be easily determined by measuring the current flowing through a pixel when the illumination is switched off.

To read the memory, an appropriate bias is applied to the selected pixel using the bit-line and word-line, whether or not current flow is dependent on the charging state of the dot. As light is used to change the charging state of the dot, in the absence of light, it is possible to configure the device so that it will retain the charging state of the dot even if the power is switched off. Therefore, the device provides a non-volatile memory.

Preferably, current sensors are provided to the word-lines and bit-lines to sense the change in the tunnelling conditions of the individual elements.

Another type of memory array can also be fabricated, where different dots in each element are configured to photo absorb at different wavelengths. This type of array provides an optically addressable memory structure. Absorption at different wavelengths may be achieved by varying the size or composition of the quantum dots within each element. Therefore, preferably at least one memory element comprises a plurality of first quantum dots, and wherein at least one quantum dot in the said element is configured to absorb radiation with a different wavelength to that of at least one other dot within the same element. Of course, each element in the array or a plurality of elements in the array could be configured to have dots which can absorb at a plurality of different wavelengths.

In order to fabricate either the photon detector array or the memory array, it is preferable if the above photon detector is etched to form columns or a mesa. The columns may be etched down as far as the dot layer and are arranged to isolate regions of preferably at most 1000 dots, more preferably at most 100 dots. Alternatively, an electrode layer provided on a top of said structure may be etched in order to define isolated active areas of dots each comprising at most 1000 dots, more preferably at most 100 dots.

The bit-lines and word-lines may fabricate as part of the semiconductor structure. Strips of emitter may be formed underlying the array such that lines of pixels are arranged with a common emitter. The collector may then be etched to form lines which cross the emitter lines. The areas where the emitter and collector cross are active areas of the detector. Such an arrangement could be achieved by using a re-growth technique.

BRIEF DESCRIPTION OF THE DRAWINGS

The present invention will now be described with reference to the following non-limiting embodiments in which:

FIGS. 1a and 1b show schematic band structures of a detector in accordance with an embodiment of the present invention in a specific mode of operation;

FIGS. 2a and 2b show a schematic band structure of the device of FIG. 1 operated at a different voltage;

FIG. 19a shows a variation on the layer structure of FIG. 18a; FIG. 19b is a schematic showing variations in the band gap of the corresponding structure;

DESCRIPTION OF THE PREFERRED EMBODIMENTS

Figure 3:
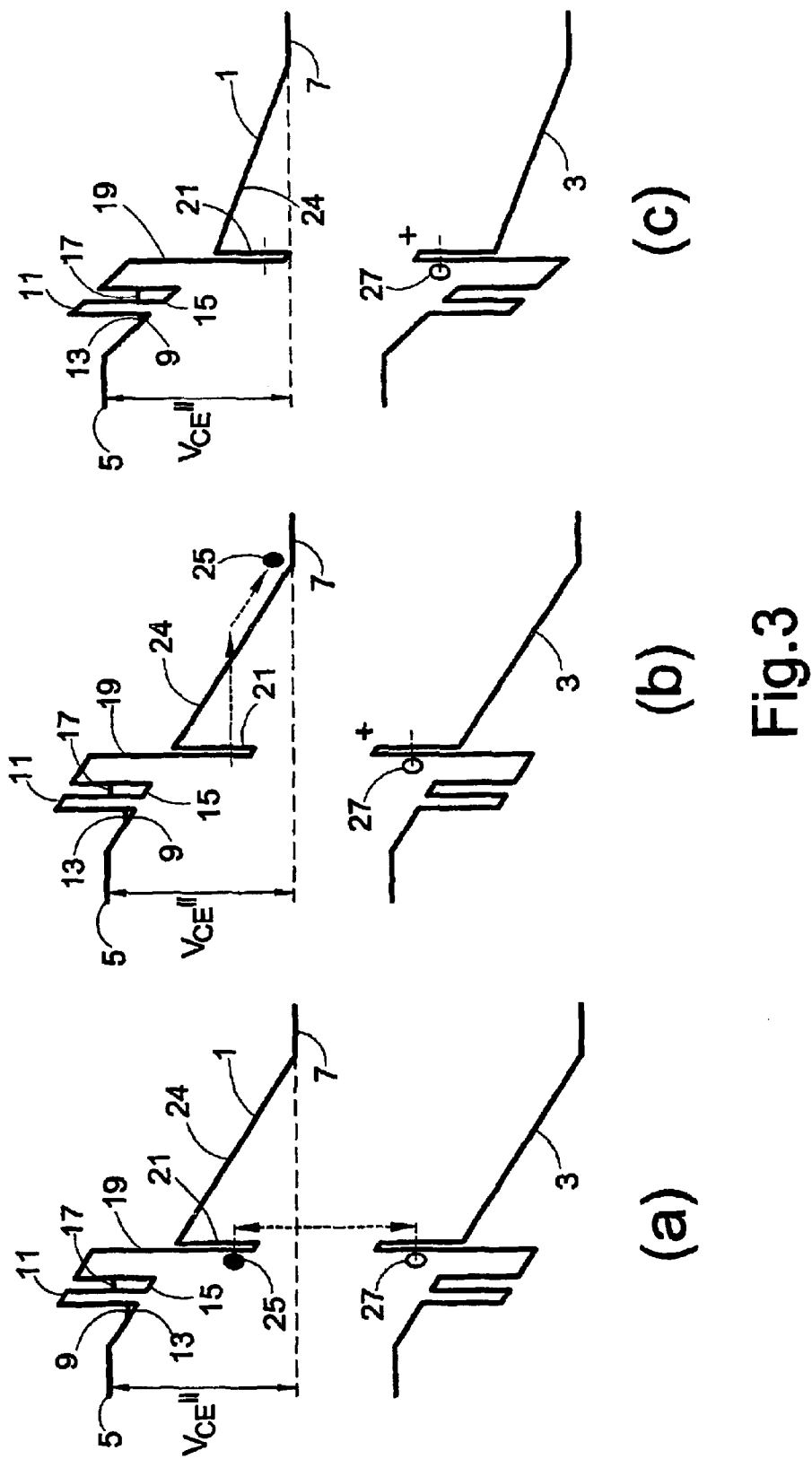
FIGS. 3a, 3b and 3c show schematic band structures of a detector in accordance with a further embodiment of the present invention.

FIG. 1A and FIG. 1B are schematic band structures which are used to illustrate a mode of operation for a photon detector.

A conduction band 1 and a valence band 3 is shown. FIG. 1A shows the detector prior to illumination. FIG. 1B shows the detector after illumination.

An emitter 5 and a collector 7 are provided at either end of the detector. An emitter-collector bias $V_{ce}$ is applied across the detector such that the potential of the collector 7 is lower than that of the emitter 5, thus inducing the flow of electrons from the collector to the emitter. In this example, the carriers will be electrons. However, it will be appreciated by those skilled in the art that detector could be configured with holes as the majority carrier.

The detector comprises a first low dimensional system 9 which is located between the emitter 5 and the first barrier layer 11. Electrons in the low dimensional layer 9 have an energy of the first energy level 13 (this level can be seen more clearly on FIG. 1B). Adjacent the barrier layer 11 and on the opposing side to the first low dimensional system 9 is a second low dimensional system 15. The second low dimensional system 15 is capable of confining electrons with a second energy level 17. In the detector shown in FIG. 1A (before illumination), the first energy level 13 and the second energy level 17 align.

Adjacent the second low dimensional system 15 is a second barrier layer 19. The second barrier layer 19 is thin enough so that when the first 13 and the second 17 energy levels align, resonant tunnelling takes place through the first barrier layer 11 and the second barrier layer 19. An absorption layer 23 is then provided between the second barrier layer 19 and the collector 7. A quantum dot layer 21 is then provided in said absorption layer 23 on the opposing side of the second barrier layer to that of the second low dimensional system 15.

Due to the alignment between the first and second energy levels 13, 17, charge flows freely from the emitter 5 to the collector 7 when a bias $V_{ce}$ is applied. The alignment of the first and second energy levels will be dependent on the magnitude of the applied bias. The magnitude $V_{ce}$ is chosen such that the energy levels 13 and 17 align.

FIG. 1B shows the same device as that of FIG. 1A. However, the device has been illuminated. To avoid unnecessary repetition, like numerals have been used to denote like features. On absorption of a photon, an electron-hole pair is excited, here shown as electron 25 in the conduction band and hole 27 in the valence band. The bias $V_{ce}$ causes the electron 25 to be swept towards the collector. However, the hole 27 is swept in the opposite direction and is swept into dot 21 where it is trapped. The change in the charging state of dot 21 causes a change in the alignment of the first energy level 13 and the second energy level 17. As these two levels do not now align, the detector is brought "off-resonance" and tunnelling through the first barrier layer is suppressed.

Therefore, the charge cannot flow freely from the emitter 5 to the collector 7. This change in current can easily be detected and signifies the absorption of a single photon.

In the above device, the photon detector is switched on by applying collector/emitter bias $V_{ce}$ across the detector. When a single photon is absorbed, the emitter/collector current is reduced.

FIG. 2 shows operation of the device of FIG. 1 at a different bias V'ce. To avoid unnecessary repetition, like reference numerals will be used to denote like features. In the case of FIG. 1, the device was on-resonance i.e. the first and second energy levels were aligned, before illumination. In the device of FIG. 2, the first energy level 13 and the second energy level 17 are misaligned prior to photon absorption. After an electron-hole pair has been excited as shown in FIG. 2B, the charging of quantum dot 21 with a hole causes the first 13 and second 17 energy levels to align, thus allowing charge to flow freely from the emitter 5 to the collector 7.

In this mode of operation, the detector is again switched on by applying a bias across the collector/emitter. However, current flow is suppressed since the first and second energy levels do not align. Upon illumination, absorption of a single photon and subsequent capture of one of the photo-excited carriers by a quantum dot causes the levels to align. Hence, there is a detectable increase in the current.

In both of FIGS. 1 and 2, photon is absorbed in the absorption layer. However, the device can also be configured such that incident illumination causes absorption of a photon in the quantum dot. This type of device is shown in FIGS. 3 to 5.

FIG. 3a shows a variation on the device of FIGS. 1 and 2. To avoid unnecessary repetition, like reference numerals will be used to denote like features. The device operates at emitter 5/collector 7 bias $V''_{ce}$. This bias serves to misalign the first 13 and second 17 energy levels prior to illumination. Second barrier layer 19 is thicker in the device of FIG. 3 than those shown in FIGS. 1 and 2. Also, instead of absorption layer, buffer region 24 is provided. Buffer region 24 may be identical to the absorption layer 23 described in relation to FIGS. 1 and 2. However, in this particular example, there is no need for buffer layer 24 to be able to absorb incident radiation. The device is illuminated with radiation having a frequency substantially equal to that of an interband optical transition of the quantum dot 21. This causes photo excitation of an electron 25 into the conduction band of dot 21 and a hole 27 into the valence band of dot 21. This excited state is not stable and the electron 25 tunnels out of dot 21 towards the collector 7. This leaves just hole 27 in the valence band 3. Tunnelling of the hole 27 from the valence band towards the emitter 5 is largely suppressed by the thick barrier layer 19.

FIG. 3c shows a stable condition where the hole 27 is trapped in dot 21 and provides a positive charge. This change in the charging state of dot 21 affects the alignment of energy levels 13 and 17 such that the levels align. The alignment of these levels allows resonant tunnelling to occur through barrier layers 11 and 19.

Figure 4:
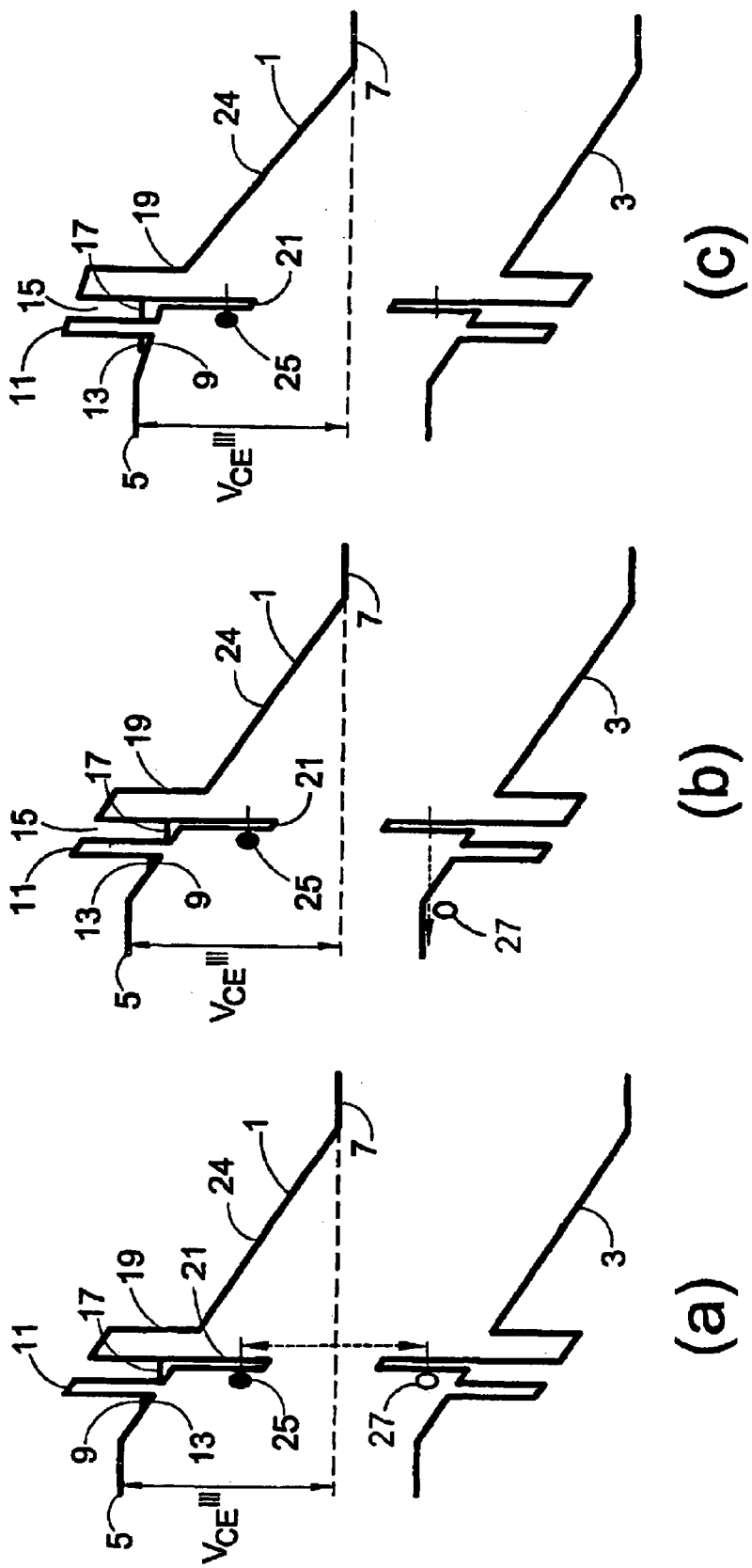
FIGS. 4a, 4b and 4c show schematic band structure of a detector in accordance with a yet further embodiment of the present invention.
Figure 5:
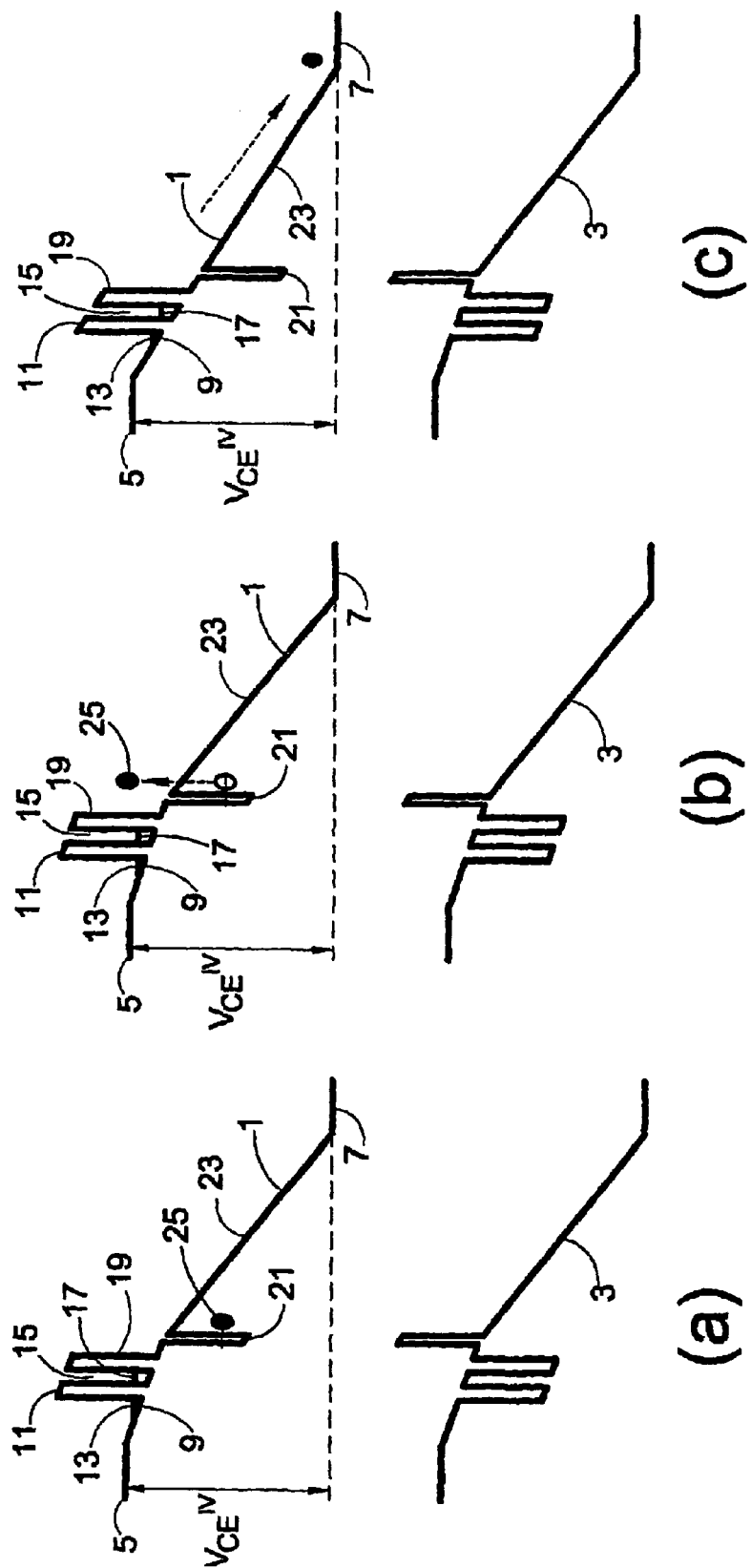
FIGS. 5a, 5b and 5c show schematic band structures of a further detector in accordance with an embodiment of the present invention.

FIG. 4 shows a variation on the device of FIG. 3. To avoid unnecessary repetition, like reference numerals will be used to denote like features. The principle of operation of this device is very similar to that of FIG. 3. However, in this example, an electron remains trapped within the quantum dot 21 and hole 27 tunnels out of the quantum dot towards emitter 5. In this specific example, the dot 21 is located in the second active layer 15 between the first 11 and second 19 tunnel barriers.

The device operates at an operating voltage of $V'''_{ce}$. At this bias as shown in FIG. 4a, the first energy level 13 and the second energy level 17 are misaligned. Upon illumination with radiation having a frequency substantially equal to that of the band gap of the quantum dot, an electron 25 and hole 27 are photo-excited within the quantum dot 21.

As this state is not stable, hole 27 tunnels out of the quantum dot 21 into the emitter 5. This is shown in FIG. 4b. Tunnelling of the electron 25 towards the collector 7 is largely suppressed due to the thick barrier layer 19.

FIG. 4c schematically illustrates a situation where just the electron 25 is trapped within quantum dot 21. This negative charge on the dot 21 causes alignment of first energy level 13 with second energy level 17. This will then allow resonant tunnelling carriers through barriers 11 and 19 and hence, a larger current can flow from the emitter 5 to the collector 7.

The above four figures have all shown the situation where an interband transition occurs, i.e. carriers are excited into the conduction or valence bands. However, the device can also work in an intraband mode where illumination just serves to excite carriers within the conduction band or valence band. A device working on this principle is shown in FIG. 5.

FIG. 5a shows the device prior to absorption. The structure of the device is essentially identical to that of FIGS. 1 and 2. Therefore, to avoid unnecessary repetition, like reference numerals will be used to denote like features. The device is operated at an emitter 5/collector 7 bias of $V^{1V}{}_{ce}$. At this bias, the first energy level 13 is aligned with the second energy level 17 so that tunnelling occurs through the barriers 11 and 19. Therefore, in this situation, current can flow freely from the emitter 5 to the collector 7. In this state, an electron 25 is located within the conduction band 1 of dot 21.

FIG. 5b shows the situation after illumination with radiation having an energy substantially equal to that of an intraband transition within the quantum dot 21. Electron 25 is excited to a higher energy state from which it can be tunnelled out of the quantum dot 21. After illumination, the electron 25 which is now no longer contained within quantum dot 21 flows toward the collector 7. This causes a change in the charging state of dot 21 which affects the alignment of first energy level 13 and second energy level 17. This is shown in FIG. 5c. As the first and second energy levels are not aligned, resonant tunnelling cannot occur and charge does not flow freely from the emitter 5 to the collector 7.

Figure 6:
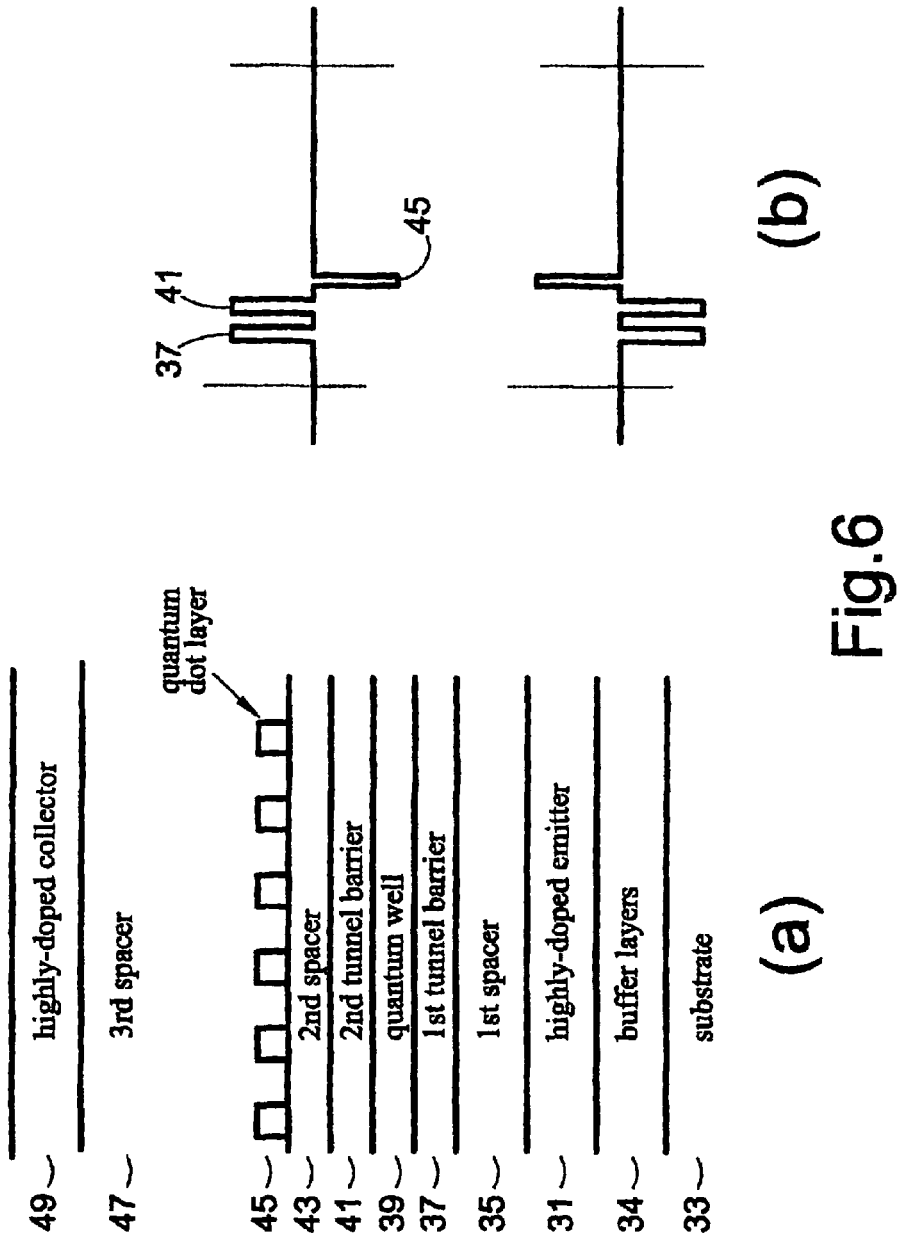
FIG. 6a shows a schematic layer structure of a device in accordance with an embodiment of the present invention.
FIG. 6b is a schematic showing variations in the band gap of the corresponding structure.

FIG. 6 shows a schematic layer structure of a device in accordance with an embodiment of the present invention. An emitter layer 31 which will preferably be a highly doped semiconductor layer is formed overlying and in contact with buffer layer 34. Buffer layer 34 is formed overlying and in contact with substrate 33. A lower spacer layer 35 is then formed overlying and in contact with the emitter layer 31. A first barrier layer 37 is then formed overlying and in contact with first spacer layer 35. The first spacer layer 35 and first barrier layer 37 are configured such that the junction between the first barrier layer 37 and the first spacer layer 35 is capable of supporting a low dimensional system for example, it could be capable of supporting two dimensional confinement.

A quantum well layer 39 is then formed overlying and in contact with the barrier layer 37. The quantum well layer 39 is capable of supporting low dimensional confinement of the carriers such as a two dimensional confinement gas. A second barrier layer 41 is then formed overlying and in contact with said quantum well layer 39. A second spacer layer 43 is then formed overlying and in contact with said second barrier layer 41. A layer of quantum dots 45 is then formed overlying and in contact with said second spacer layer 43. A third and final spacer layer 47 is then formed overlying and in contact with said quantum dot layer 45 and said second spacer layer 43. The second 43 and third 47 spacer layers together form an absorption layer. A collector layer which comprises a highly doped semiconductor layer 49 is then provided overlying and in contact with said absorption layer 47. A schematic showing the variation in the band gap of the structure of FIG. 6a is shown in FIG. 6B. The features of FIG. 6a have been numbered on FIG. 6b.

Figure 7:
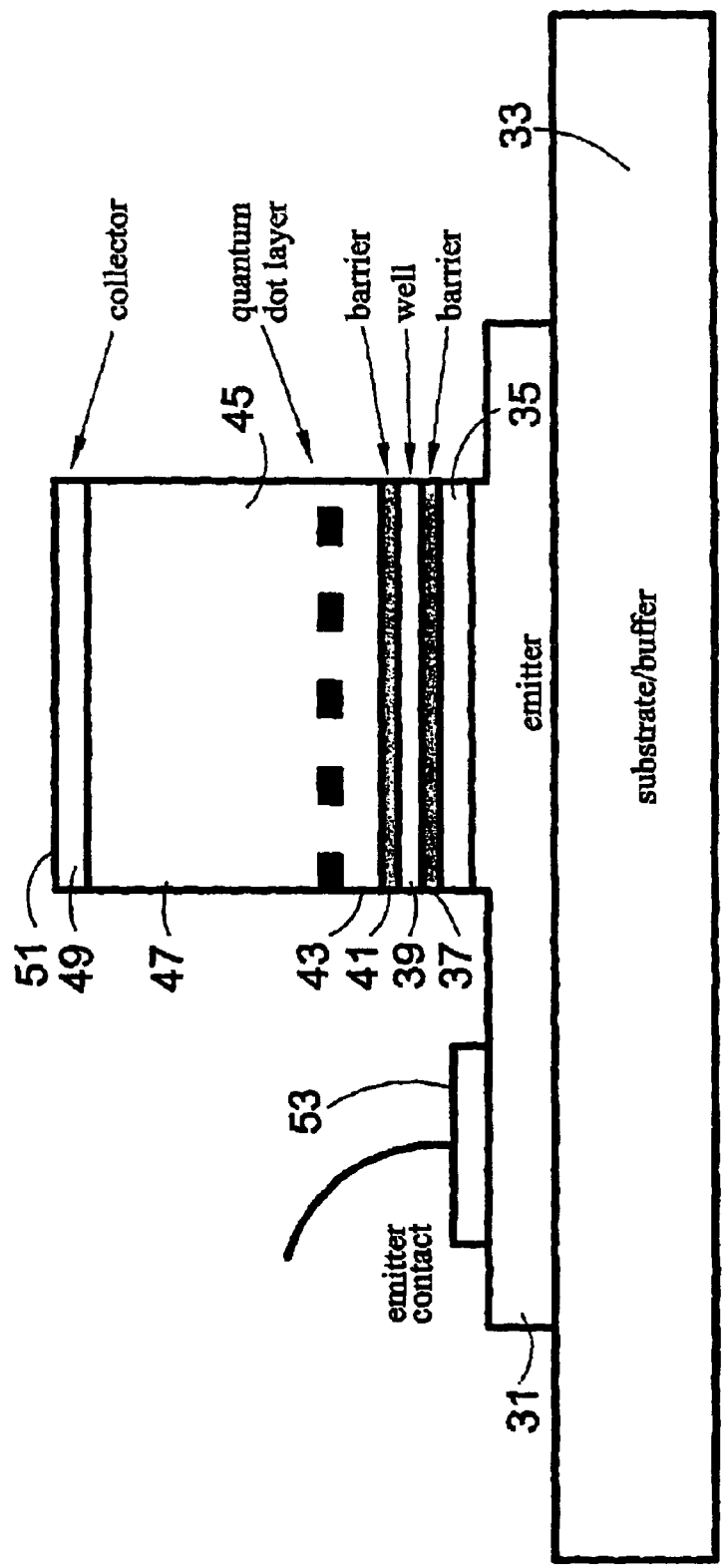
FIG. 7 shows a schematic device structure in accordance with an embodiment of the present invention based on the layer structure of FIG. 6.

FIG. 7 shows the layer structure of FIG. 6 after fabrication.

Figure 23:
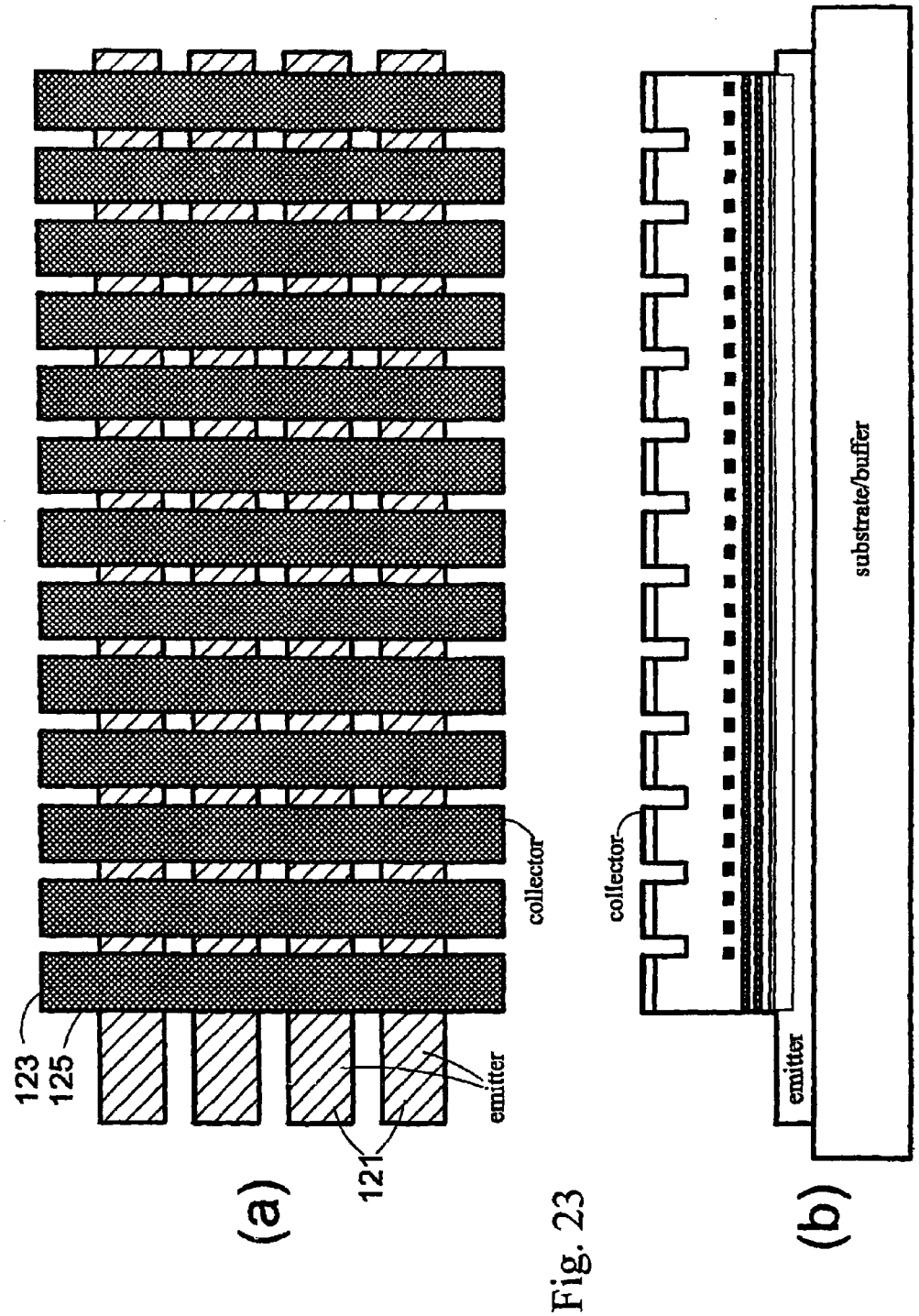
FIG. 23a shows a schematic cross-section of a memory device or detector array.
FIG. 23b shows the corresponding plan view.

The structure is etched down to the emitter 31 to form mesa 51 such that at least part of emitter 31 extends away from mesa 51 such that a contact 53 can be made to the emitter away from the mesa 51. Emitter contact 53 is preferably an ohmic contact such as those made from NiGeAu. The mesa may have an area of at most $10^{-10}$ m$^2$. Therefore, it is difficult to form a single isolated contact at the top of mesa 51. Instead, contact metal will be applied to the mesa which will extend from the collector away from the mesa, such that a collector contact can be made away from the mesa 51. Methods for contacting the collector will be described in more detail with reference to FIG. 23.

The operation of the device has been described with reference to FIGS. 1 to 5. The first low dimensional system layer 9 is formed at the junction of first spacer layer 35 and first barrier layer 37. The first and second barrier layers 11, 19 of FIGS. 1A and 1B correspond to the first and second barriers layer 37 and 41 of FIG. 6. The second confined low dimensional system 15 corresponds to quantum well layer 39 in FIG. 6.

In FIG. 6, a plurality of quantum dots are shown in quantum dot layer 45 When operating as a single photon detector, the detector will generally only be required to detect one photon at a time. A single photon will result in a carrier being trapped in a single quantum dot.

Figure 8:
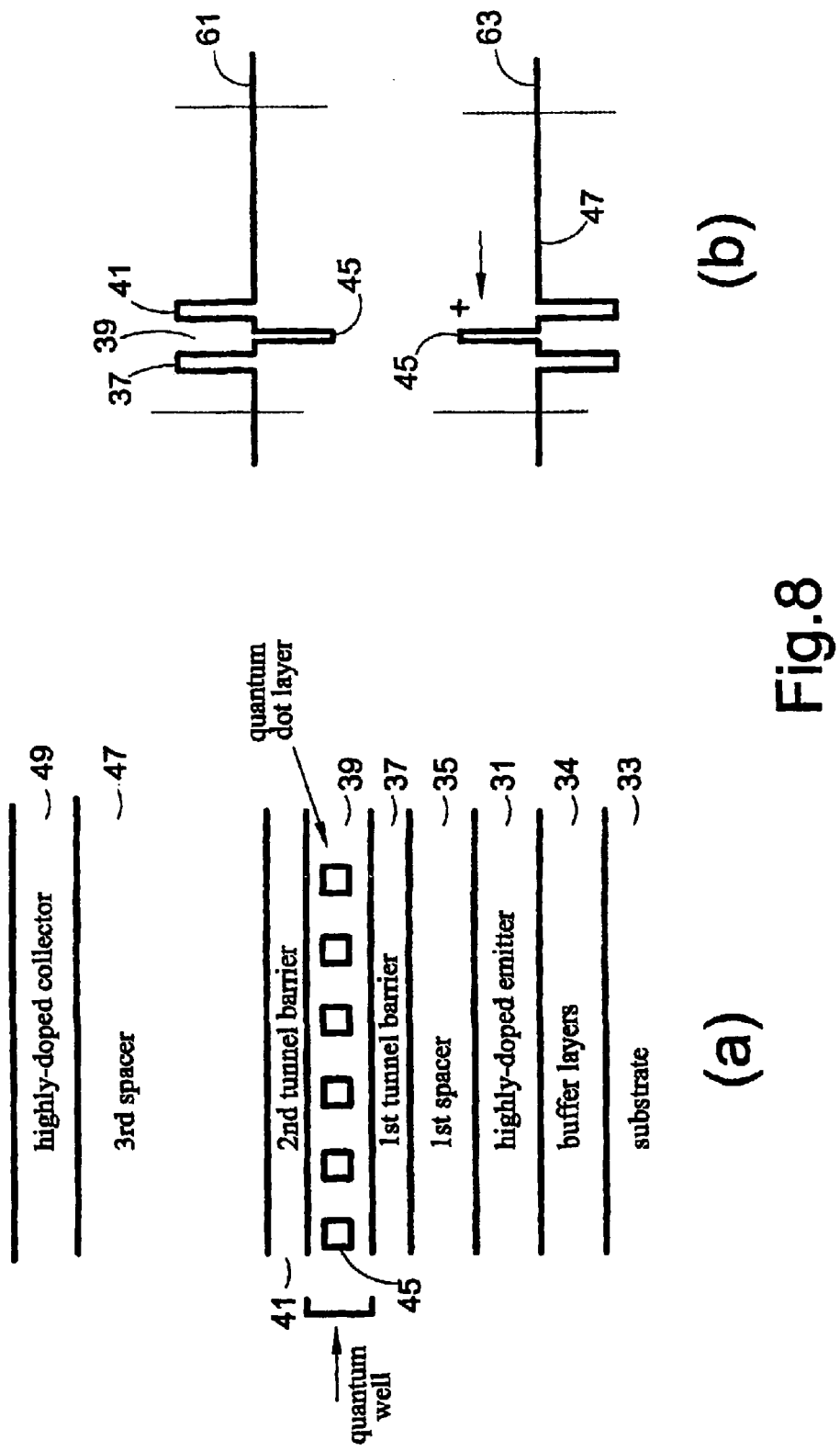
FIG. 8a shows a variation on the layer structure of FIG. 6 in accordance with an embodiment of the present invention.
FIG. 8b.

FIG. 8 shows a variation on the structure of FIG. 6. To avoid unnecessary repetition, like reference numerals will be used to denote like features. The layer formation shown in FIG. 8 is similar to that shown in FIG. 6 up to the formation of the first tunnel barrier 37. However, the quantum dot layer 45 which is provided between the second and third spacers in FIG. 6 (i.e. within the absorption layer) is now formed within the quantum well layer 39. This structure would be fabricated by forming the first half of the quantum well layer 39, forming the quantum dot layer 45 and then forming the remainder of the quantum well layer 39. The second tunnel barrier 41 is then formed overlying the quantum well layer 39. A third spacer layer 47 (which forms an absorption layer) is then formed overlying the second barrier layer 41. The collector 49 is formed as previously described. The detector is then fabricated in the same way as described with reference to FIG. 7.

FIG. 8B schematically shows how the band gap varies for this device. The conduction band 61 and the valence band 63 are shown. Looking at the conduction band 61, the two barrier layers 37 and 41 are shown as maximums in the conduction band 61. The quantum well layer 39 is shown interposed between the two barrier layers 37, 41 and the quantum dot layer 45 is shown located within the quantum well 39. Following the arrangement described with reference to FIGS. 1 and 2, upon illumination, a hole is swept from the absorption layer 47 into the quantum dot 45 which affects the relative separation of the first and second energy levels. This device could also be configured to operate in the manner described with reference to FIGS. 3 to 5.

Figure 9:
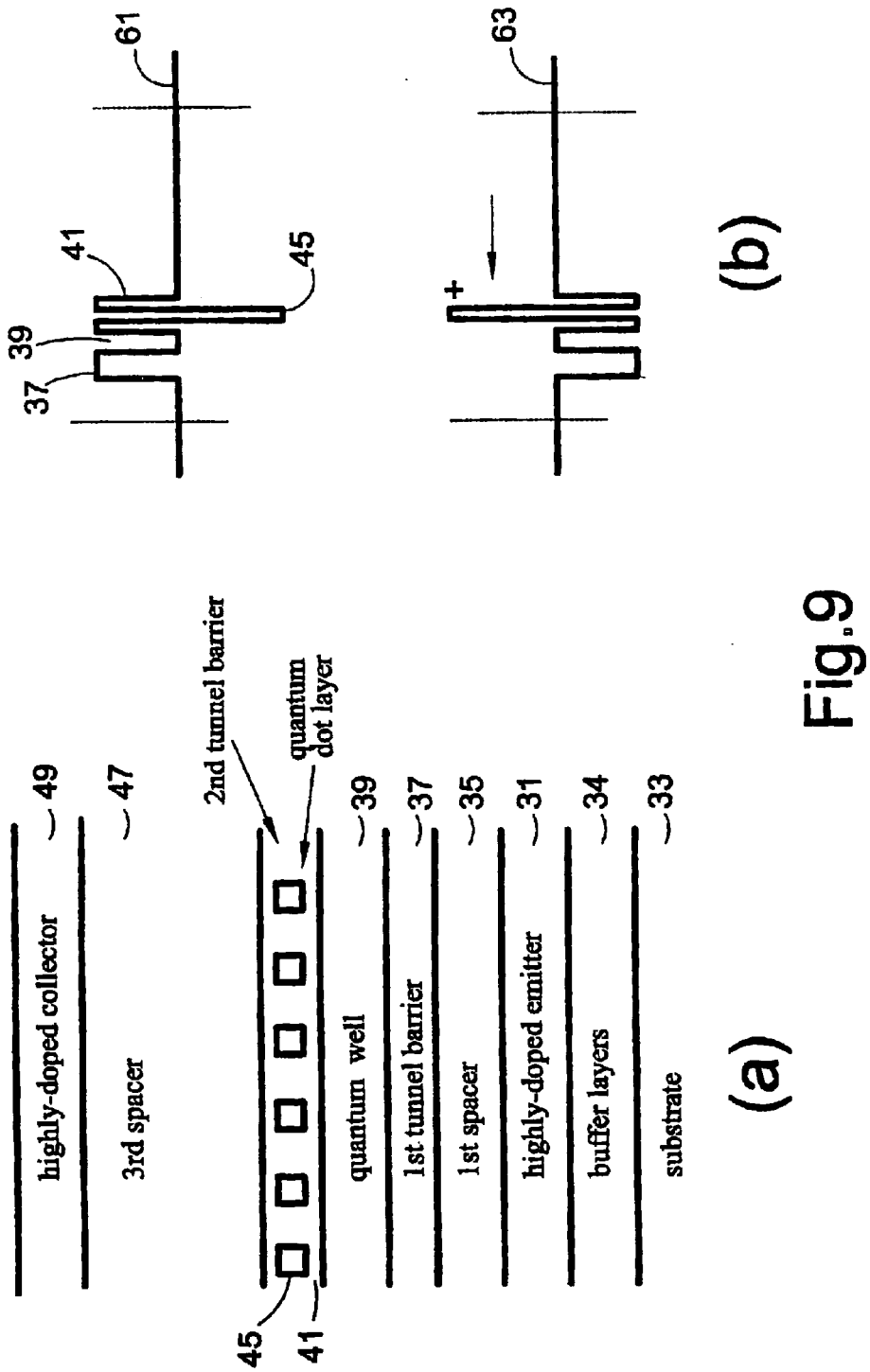
FIG. 9a shows a further variation on the layer structure of the detector of FIG. 6 in accordance with an embodiment of the present invention.
FIG. 9b is a schematic showing variations in the band gap of the corresponding structure.

FIG. 9 shows a further variation on the basic structure of FIG. 6. Again, to avoid unnecessary repetition, like features will be denoted with like reference numerals.

Here, the quantum dot layer 45 is provided within the second tunnel barrier 41. The fabrication of the device remains identical to that described for FIG. 6 up to quantum well layer 39. The second tunnel barrier 41 is formed in a two stage process where the first half of the tunnel barrier is formed, then the quantum dot layer 45 is formed, then the remainder of the second tunnel barrier layer 41 is formed. The third spacer layer 47 is then formed overlying and in contact with the second barrier layer 41. The collector 49 is then formed as previously described. The detector is then fabricated in the same way as described with reference to FIG. 7.

The variations in the band gap of this structure are shown schematically in FIG. 9B. Here, the quantum dot, 45 forms a minima in the second tunnel barrier 41. As described with reference to FIGS. 1 and 2, in the arrangement shown in FIGS. 1 and 2, a photo generated hole is swept into the second barrier layer 41 and trapped in the quantum dot 45 thereby affecting the relative separation of the first and second energy levels. The device could also be configured to operate in the manner described with reference to FIGS. 3 to 5.

Figure 10:
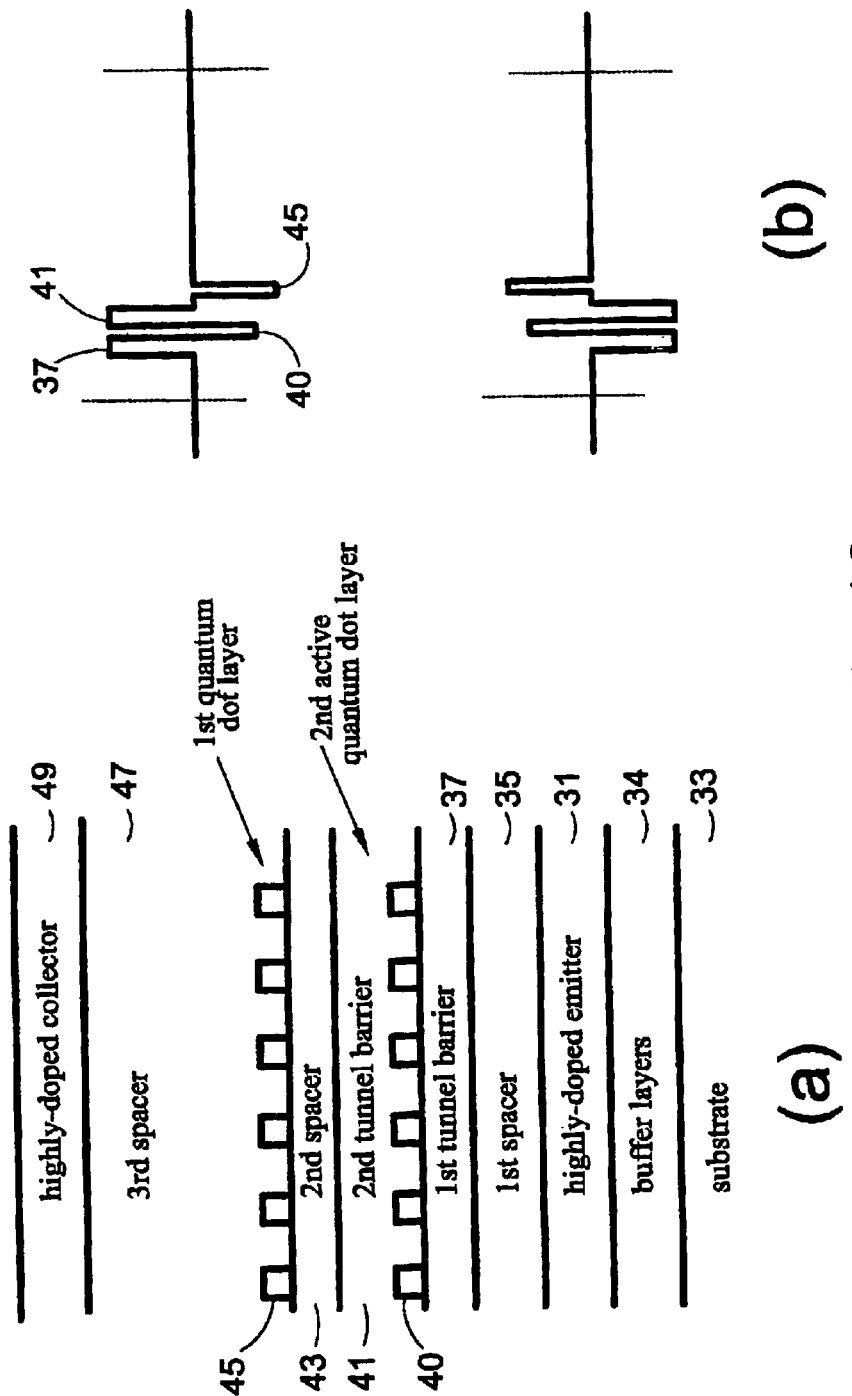
FIG. 10a shows a yet further variation on the layer structure of FIG. 6 in accordance with an embodiment of the present invention.
FIG. 10b is a schematic showing variations in the band gap of the corresponding structure.

FIG. 10 shows a further variation on the device of FIG. 6, here, two quantum dot layers are used. Comparing the device exactly with that of FIG. 6, like reference numerals are used to denote like features to avoid unnecessary repetition.

The quantum dot layer 45 provided within the absorption layer 47 as described with reference to FIG. 3. However, the quantum well layer 39 is substituted with a second quantum dot layer 40 which will be referred to as the second active dot layer 40. This layer 40 provides the second low dimensional system 15 as described with reference to FIGS. 1 and 2. The second active dot layer 40 is formed in the same manner as dot layer 45 in FIG. 8.

The structure is then processed as described with reference to FIG. 7.

Figure 11:
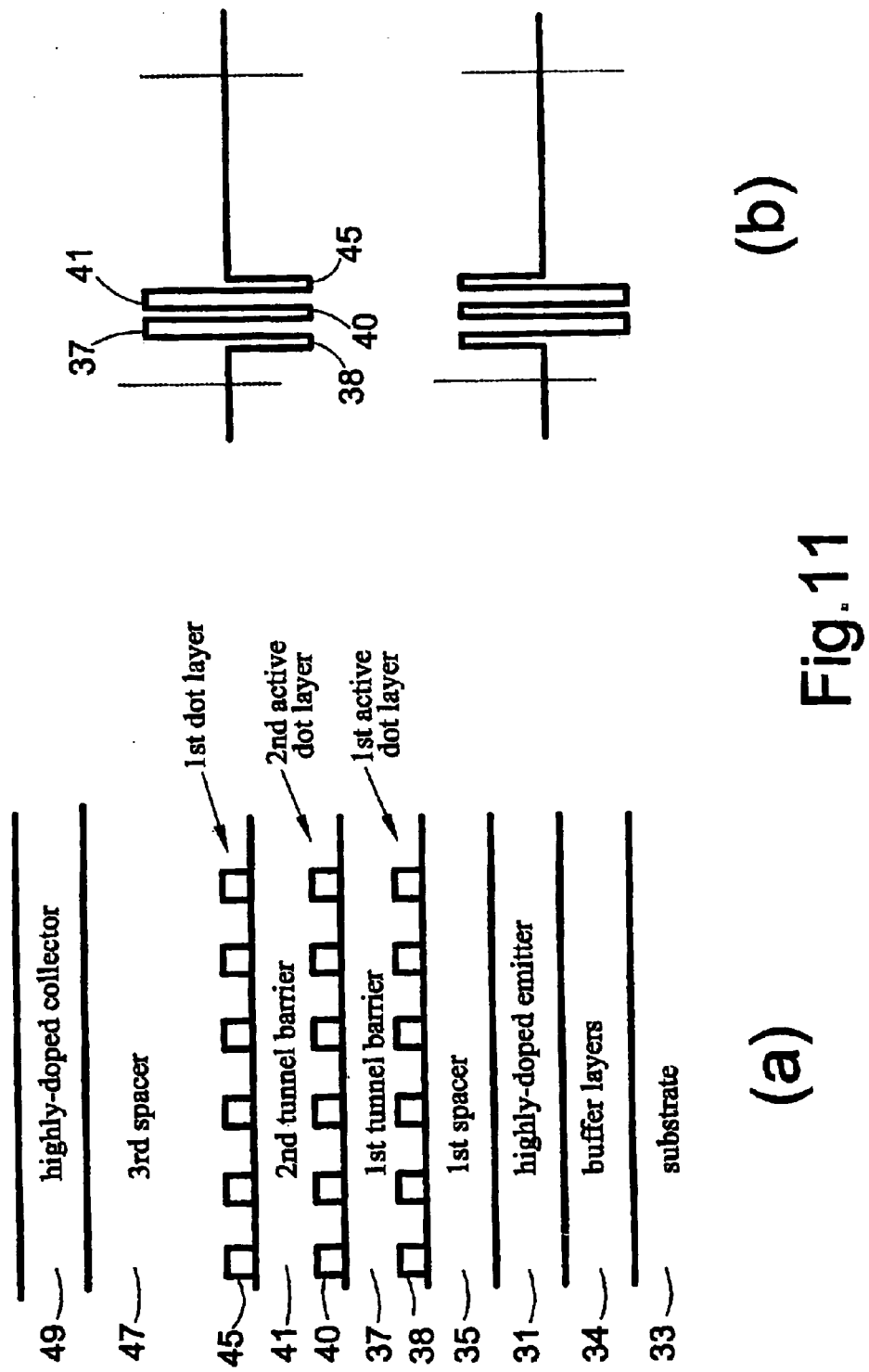
FIG. 11a shows a yet further variation on the layer structure of FIG. 6 in accordance with an embodiment of the present invention.
FIG. 11b is a schematic showing variations in the band gap of the corresponding structure.

FIG. 11a shows a variation of the device of FIG. 10. Here, a third quantum dot layer is provided in the first tunnel barrier 37. The second spacer layer 43 is removed and the first quantum dot layer 45 is formed overlying and in contact with the second tunnel barrier layer 41. This third quantum dot layer provides the first low dimensional system 13, as described with reference to FIGS. 1 and 2 and will be referred to as the first active dot layer 38. The first active dot layer 38 is formed in the same manner as dot layer 45 described with reference to FIG. 6.

In operation, carriers will become trapped in the first quantum dot layer 45 therefore changing the alignment of the energy levels of the first 38 and second 40 active dot layers. However, it will be appreciated by those skilled in the art that if the first and second active layers are provided by quantum dots, then there is no need to have a separate quantum dot to store the charge.

Figure 12:
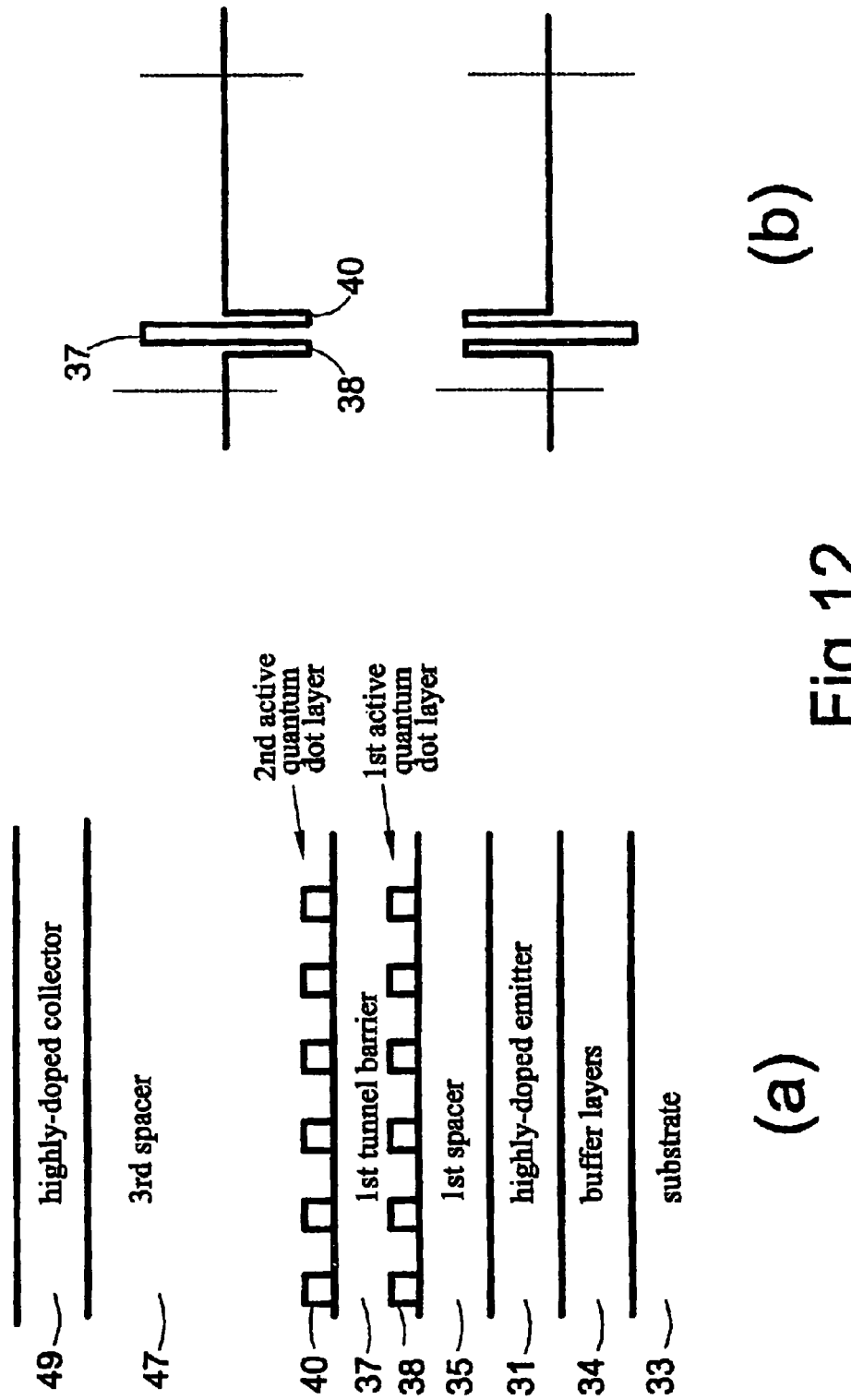
FIG. 12a shows a yet further variation on the layer structure of FIG. 6 in accordance with an embodiment of the present invention.
FIG. 12b is a schematic showing variations in the band gap of the corresponding structure.

This arrangement is shown in FIG. 12. Here, the second tunnel barrier 41 and the first quantum dot layer 45 removed. Alignment of the energy levels of the second and third quantum layers allow resonant tunnelling. However, upon illumination, a hole can be swept into either the first or second active dot layer which will affect the alignment of the energy levels and hence will vary the tunnelling characteristic of the device.

Figure 13:
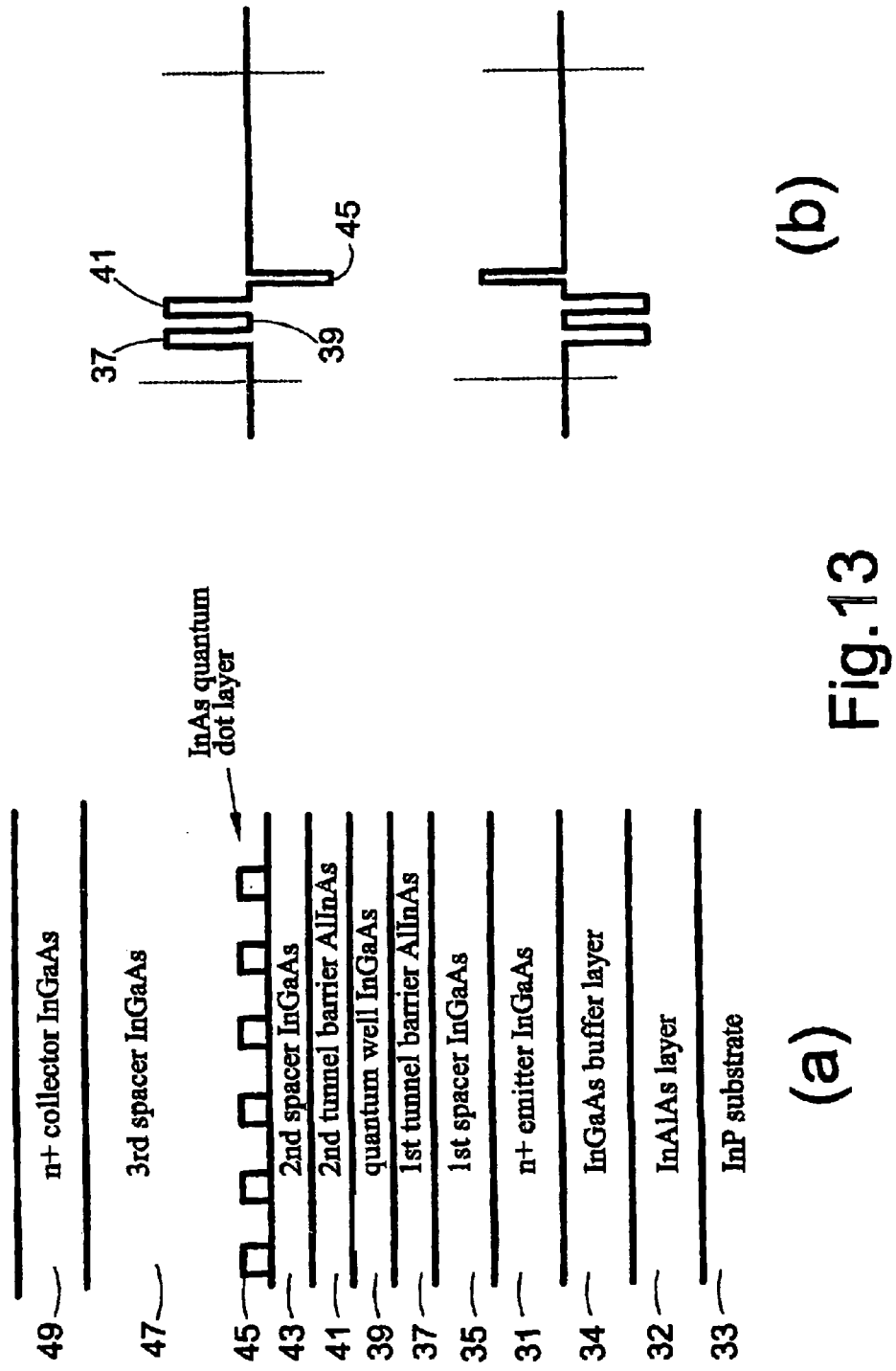
FIG. 13a shows a layer structure in accordance with an embodiment of the present invention formed on a InP substrate.
FIG. 13b is a schematic showing variations in the band gap of the corresponding structure.

FIG. 13 shows a specific structure formulated using the InGaAs/AlInAs system on an InP substrate. The preferred system uses $In_{0.53}Ga_{0.47}As/Al_{0.48}In_{0.52}As$. To avoid confusion, the same reference numerals will be used to denote the same functional layers as used with reference to FIGS. 3 to 7.

An InP substrate 33 is used. An $In_{0.52}A_{0.48}As$ matching layer 32 having a thickness of 300 nm is then formed overlying and in contact with said InP substrate 33. The $In_{0.52}Al_{0.48}As$ layer 32 is formed in order to initiate the growth. This layer could be doped to have the same polarity and dopant concentration as the emitter or could be undoped. An InGaAs buffer layer 34 having a thickness of 100 nm is then formed overlying and in contact with said matching layer 32.

An InGaAs emitter layer 31 which is doped with Si donors having a concentration of $2 \times 10^{18}$ cm$^{-3}$ and has a thickness of 500 nm is then formed overlying and in contact with said buffer layer 34.

A first spacer layer 35 of undoped InGaAs with a thickness of 50 nm is formed overlying and in contact with said heavily doped emitter layer 31. A first barrier layer 37 formed from 10 nm AlInAs is formed overlying and in contact with first spacer layer 35. A quantum well layer 39 having a thickness of 8 nm and comprising undoped InGaAs is formed overlying and in contact with said first barrier layer 37. A second barrier layer 41 formed from 10 nm of undoped AlInAs is formed overlying and in contact with said quantum well layer 39. A second spacer layer 43 comprising InGaAs which is undoped and has a thickness of 2 nm is formed overlying and in contact with said second tunnel barrier 41.

The temperature of the growth is then dropped to 530° C. and between 1.6 and 4 monolayers of InAs is formed overlying and in contact with said second spacer layer 43. Due to the low growth temperature and the substantial difference in lattice constant between InAs and InGaAs, the layer forms islands. A third spacer layer 47 of InGaAs having a thickness of 1000 to 2000 nm is then formed overlying and in contact with the second spacer layer 43 and the dot layer 45. This forms encapsulated dots. The second 43 and third 47 spacer layers together form an InGaAs absorption layer. A heavily doped $10^{18}$ cm$^{-3}$ (with Si donors) InGaAs layer of 80 nm is formed overlying and in contact with said third spacer layer 47. This heavily doped layer 49 forms the collector. The collector 49 may also be made from InAlAs to avoid photo absorption in this layer.

FIG. 13B shows the variations in the band gap of the layer structure of FIG. 10A. To avoid unnecessary repetition, like numerals have been used to denote like features. The band structure is schematic in that only layers which cause a large change in the energy of the conduction or valence bands are shown.

Figure 14:
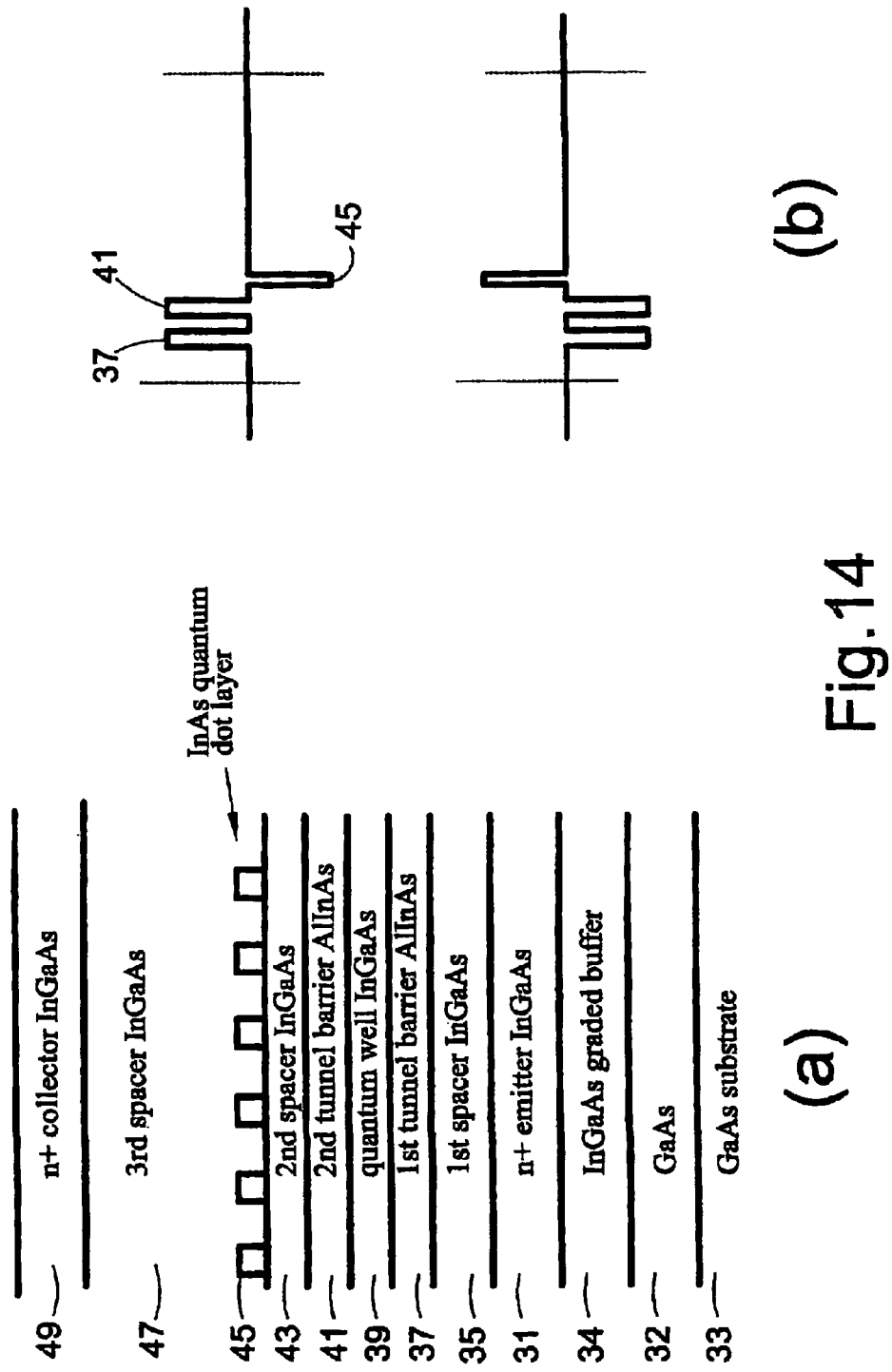
FIG. 14a shows a layer structure of a detector in accordance with an embodiment of the present invention formed on a GaAs substrate.
FIG. 14b is a schematic showing variations in the band gap of the corresponding structure.

FIG. 14 shows a further material system for forming a detector or memory in accordance with an embodiment of the present invention. This structure is formed on a GaAs substrate 33. Where possible, like reference numerals are used to denote functional like features with that of FIG. 6.

A GaAs buffer layer 32 having a thickness of 500 nm is formed overlying and in contact with said GaAs substrate 33. A 1000 to 2000 nm thick InGaAs graded buffer layer 34 is then formed in contact with and overlying said GaAs buffer layer 32. The In composition of the graded buffer layer changes from 0 to x over the course of its growth. Therefore, it is lattice matched to GaAs buffer layer 32 and $In_xGa_{1-x}As$ the following layer 31. The graded buffer layer may be doped or undoped. This InGaAs layer forms emitter 31. This emitter and the following layers are identical to those described with reference to FIG. 11, except the In content of the $In_xGa_{1-x}As$ and $In_yAl_{1-y}As$ may be different. A schematic diagram showing the variation in the band gap of the layers is shown in FIG. 12B. Again, like reference numerals have been used to denote like features.

Figure 15:
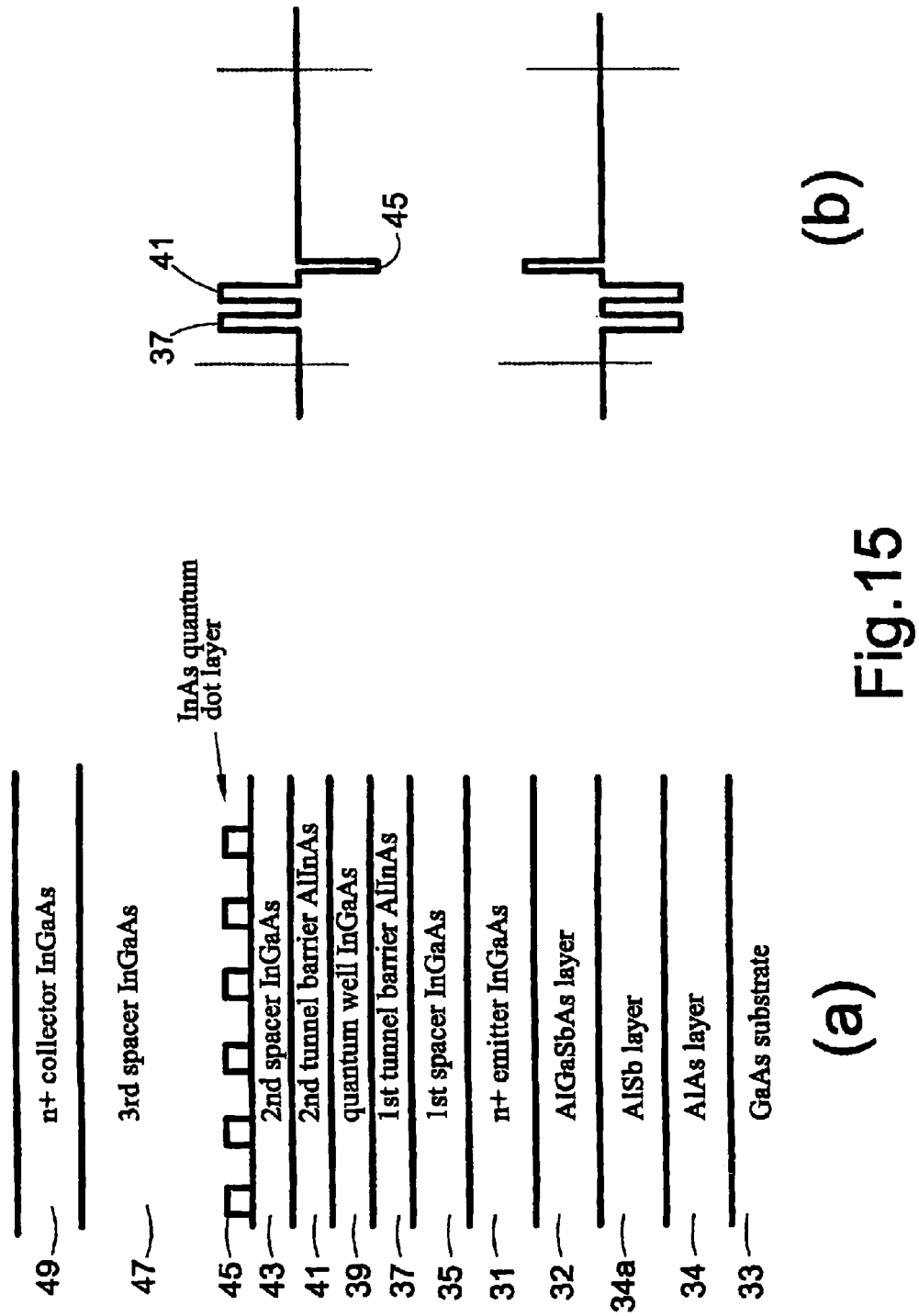
FIG. 15a shows a variation on the layer structure of FIG. 14.
FIG. 15b is a schematic showing variations in the band gap of the corresponding structure.

FIG. 15a shows a yet further variation on the layer structure of FIG. 13. Where possible, like reference numerals have been used to denote like features. The device forms the same plan as that shown in FIG. 6 where the dot layer is formed within the absorption layer.

The device is formed on a GaAs substrate 33. AlAs buffer layer 34 having a thickness of 5 nm is then formed overlying and in contact with said GaAs substrate 33. This is then followed by a AlSb layer 34a which has a thickness of 35 nm. These two layers help to initiate the growth.

A quaternary buffer layer 32 is then formed of AlGaSbAs. For instance, $(Al_{0.5}Ga_{0.5})(As_{0.55}Sb_{0.45})$ This buffer layer has a thickness from 1000 to 2000 nm. The remainder of the layers are then identical to those described with reference to FIG. 14. A diagram showing the variation in the band gap of the layer structure of FIG. 15a is shown in FIG. 15b.

Figure 16:
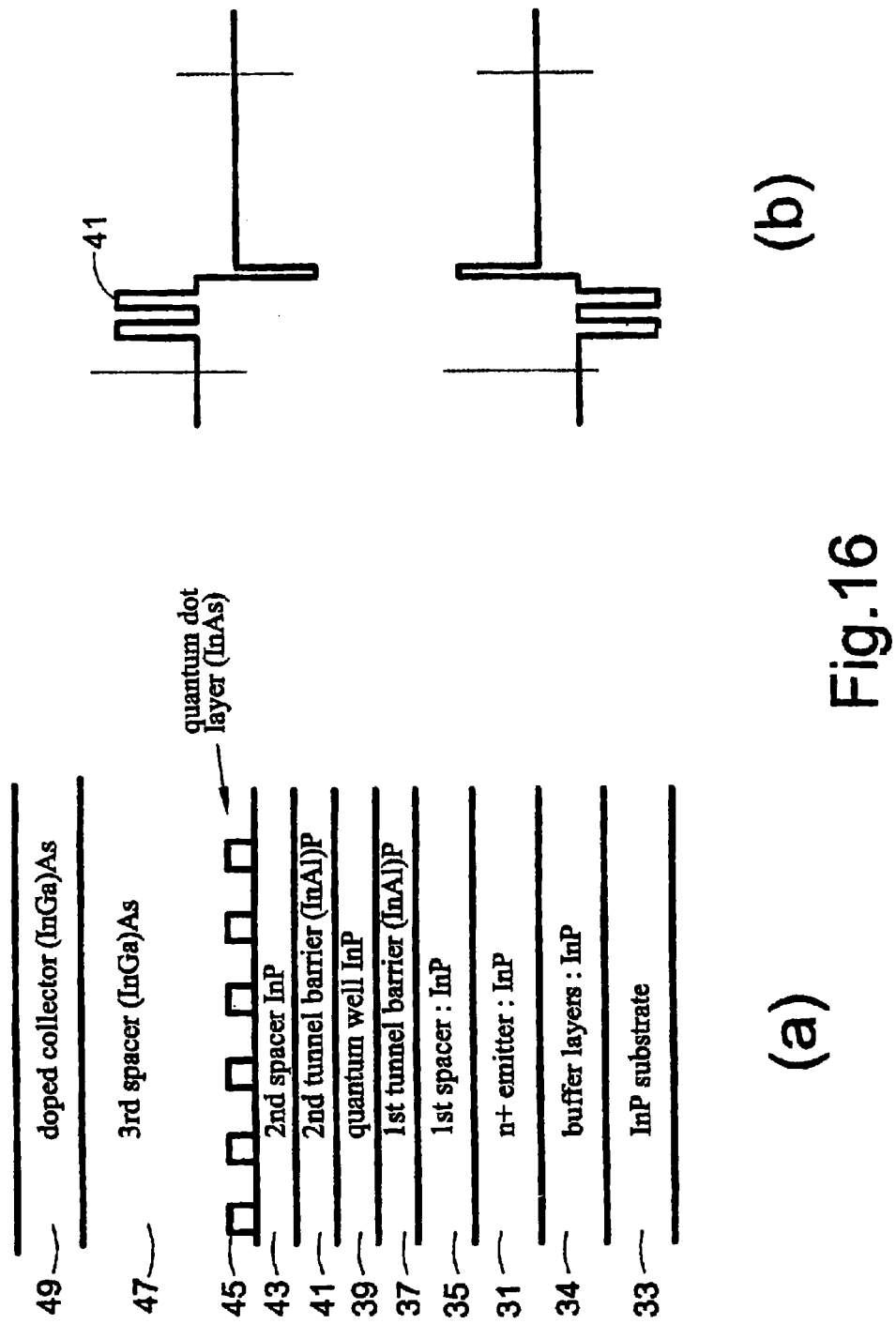
FIG. 16a shows a variation on the layer structure of FIG. 13a, FIG. 16b is a schematic showing variations in the band gap of the corresponding structure.

FIG. 16a shows a further material system for fabricating the device in accordance with an embodiment of the present invention. The device is formed on an InP substrate 33.

An undoped InP buffer layer 34 having a thickness from 1000 to 2000 nm is then formed overlying and in contact with said InP substrate 33. It should be noted that the buffer layer could also be doped like the emitter. A heavily doped $2\times10^{18}$ cm$^{-3}$ (Si donors) n type emitter 33 formed from 500 nm of InP is then formed overlying and in contact with said buffer layer 34. A first spacer layer 35 comprising 50 nm InP is formed overlying and in contact with said emitter 31.

A first barrier layer 37 comprising 10 nm of undoped InAlP is formed overlying and in contact with said first spacer layer 35. A quantum well layer 39 comprising 8 nm of undoped InP is formed overlying and in contact with said first barrier layer 37. A second barrier layer 41 comprising 10 nm of undoped InAlP is formed overlying and in contact with said quantum well layer 39. A second spacer layer 43 comprising 2 nm of undoped InP is formed overlying and in contact with said second tunnel barrier layer 41. A layer of quantum dots 45 is then formed overlying and in contact with said second spacer layer 43. These dots are formed in the same manner as those described with reference to FIG. 10. This is because there is a large difference in the lattice constant between InP and InAs. The remainder of the layers are identical to those described with reference to FIG. 13.

A diagram showing the variations in the band gap of the layer structure of FIG. 16a is shown in FIG. 16b.

Figure 17:
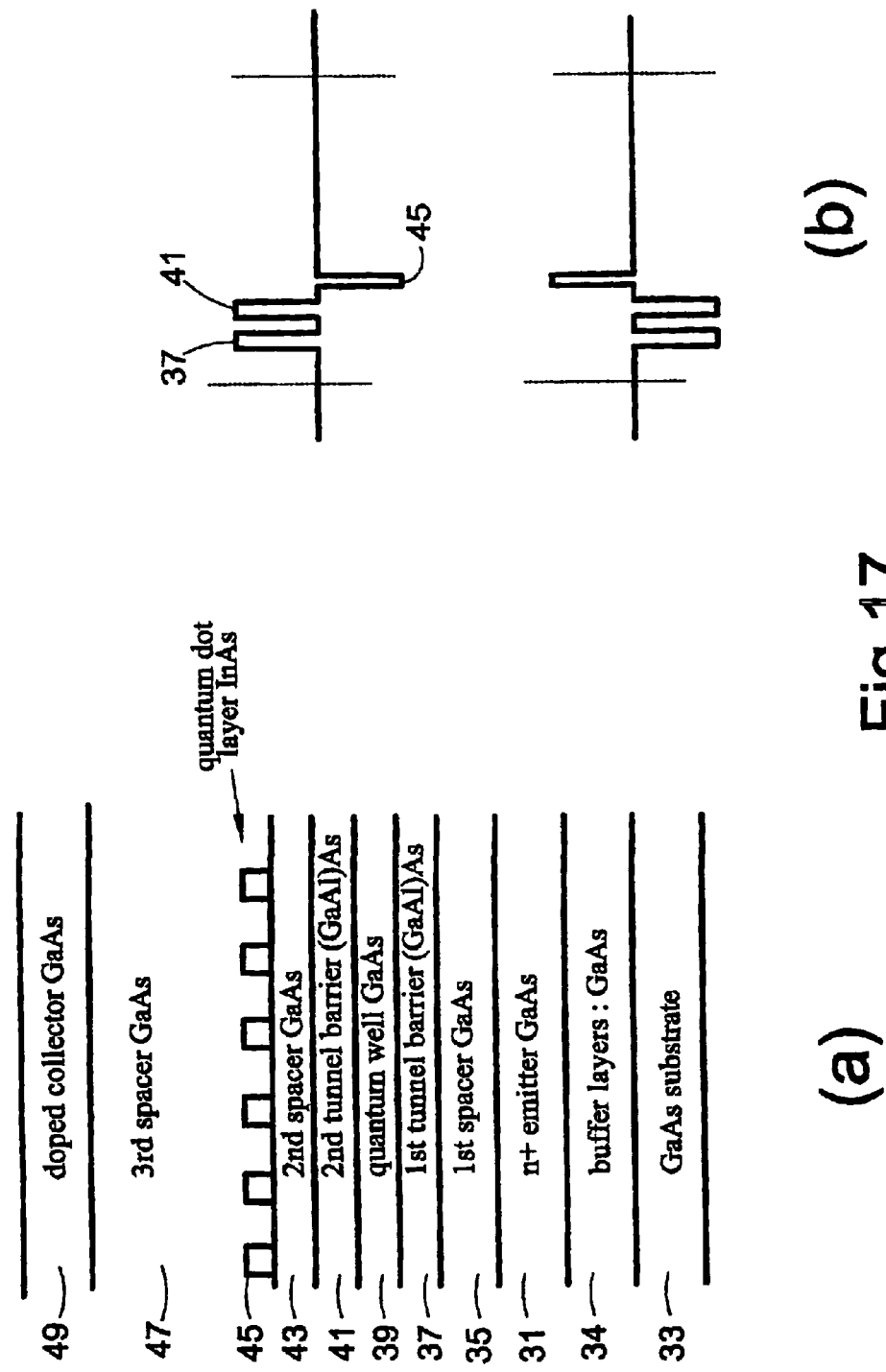
FIG. 17a shows a further variation on the layer structure of FIG. 14a, FIG. 17b is a schematic showing variations in the band gap of the corresponding structure.

FIG. 17 shows a further system which can be used to fabricate a device in accordance with the present invention. The system uses a GaAs substrate 33. A GaAs buffer layer 34 having a thickness from 1000 to 2000 nm is formed overlying and in contact with said substrate 33. It should be noted that the buffer layer 34 could also be doped to have the same polarity as that of the emitter. An emitter layer 31 comprising 500 nm of n+doped ($2\times10^{18}$ cm$^{-3}$) GaAs is formed overlying and in contact with said buffer layer 34. A first spacer layer 35 comprising 50 nm of undoped GaAs is formed overlying and in contact with said emitter 31. A first tunnel barrier layer 37 comprising 10 nm of undoped AlGaAs is formed overlying and in contact with said first spacer layer 35. The quantum well layer 39 formed from 8 nm of undoped GaAs is formed overlying and in contact with said first tunnel barrier layer 37. The second tunnel barrier layer 41 formed from 10 nm of undoped AlGaAs is formed overlying and in contact with said quantum well layer 39.

The second spacer layer of GaAs 43 having a thickness of 2 nm is formed overlying and in contact with said second barrier layer 41. A quantum dot layer 45 formed from 1.6 to 4 monolayers of InAs is then formed in the same manner as described with reference to FIG. 7. Due to the large variation in lattice constant between InAs and GaAs, the quantum dot layer forms islands. A third spacer layer comprising from 1000 to 2000 nm of GaAs is then formed overlying and in contact with said second spacer layer and quantum dot layer 45. A collector 49 comprising 80 nm of doped ($2\times10^{18}$ cm$^{-3}$ Si) GaAs is then formed overlying and in contact with said third spacer layer.

Figure 18:
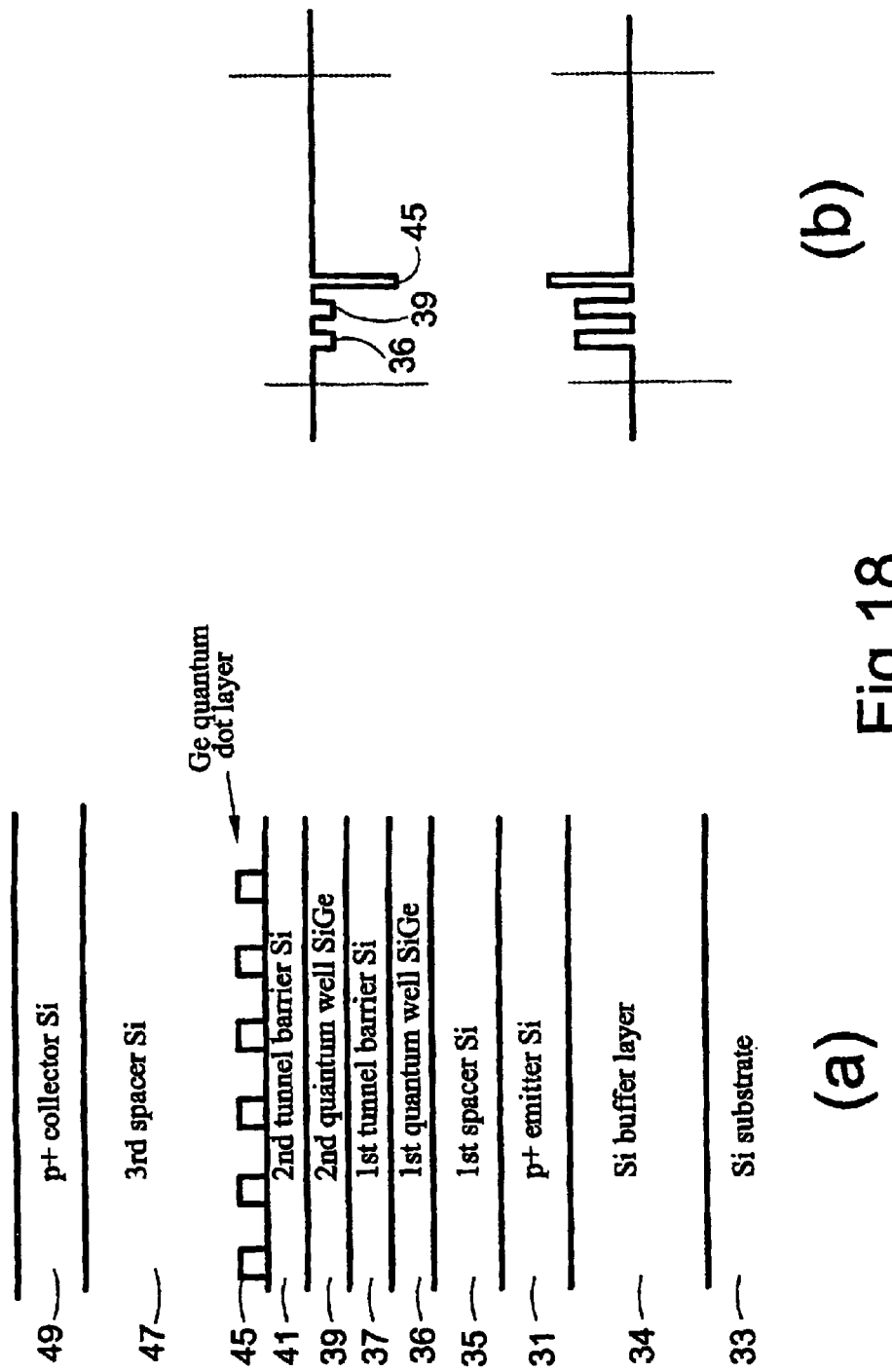
FIG. 18a shows a layer structure in accordance with an embodiment of the present invention formed using a SiGe heterostructure.
FIG. 18b is a schematic showing variations in the band gap of the corresponding structure.

FIG. 18 shows a further system which can be used to fabricate a device in accordance with an embodiment of the present invention. Here, the device is fabricated using the SiGe/Si system. A Si buffer layer 34 having a thickness of 1000 nm which is nominally undoped is formed overlying and in contact with the Si substrate 33. An emitter layer 31 which comprises 500 nm of p doped ($2\times10^{18}$ cm$^{-3}$) Si is then formed overlying and in contact with said buffer layer 34. This layer acts as the emitter. A first spacer layer comprising 50 nm of undoped Si is then formed overlying and in contact with said emitter layer 31. A first quantum well layer 36 comprising 5 nm of undoped $Si_{0.7}Ge_{0.3}$ is then formed overlying and in contact with first spacer layer 35. A first tunnel barrier layer 37 comprising 8 nm of Si is formed overlying and in contact with said first quantum well layer 36.

A second quantum well 39 comprising 5 nm of undoped SiGe is then formed overlying and in contact with said first tunnel barrier layer 37. A second tunnel barrier layer 41 comprising 8 mm of undoped Si is then formed overlying and in contact with said quantum well layer 39.

Several monolayers of Ge are formed overlying and in contact with the second tunnel barrier layer 41. Due to the substantial difference in lattice constant between Ge and Si, the layer forms islands. Third spacer layer 47 comprising 2000 nm of undoped Si is then formed overlying and in contact with said dot layer 45 to encapsulate the dots. A collector layer comprising 100 nm of p doped ($2\times10^{18}$ cm$^{-3}$) Si is then formed overlying and in contact with said third spacer layer 47.

FIG. 18b is a diagram showing schematically the differences in the band gap of the layers of the structure shown in FIG. 18a.

Figure 19:
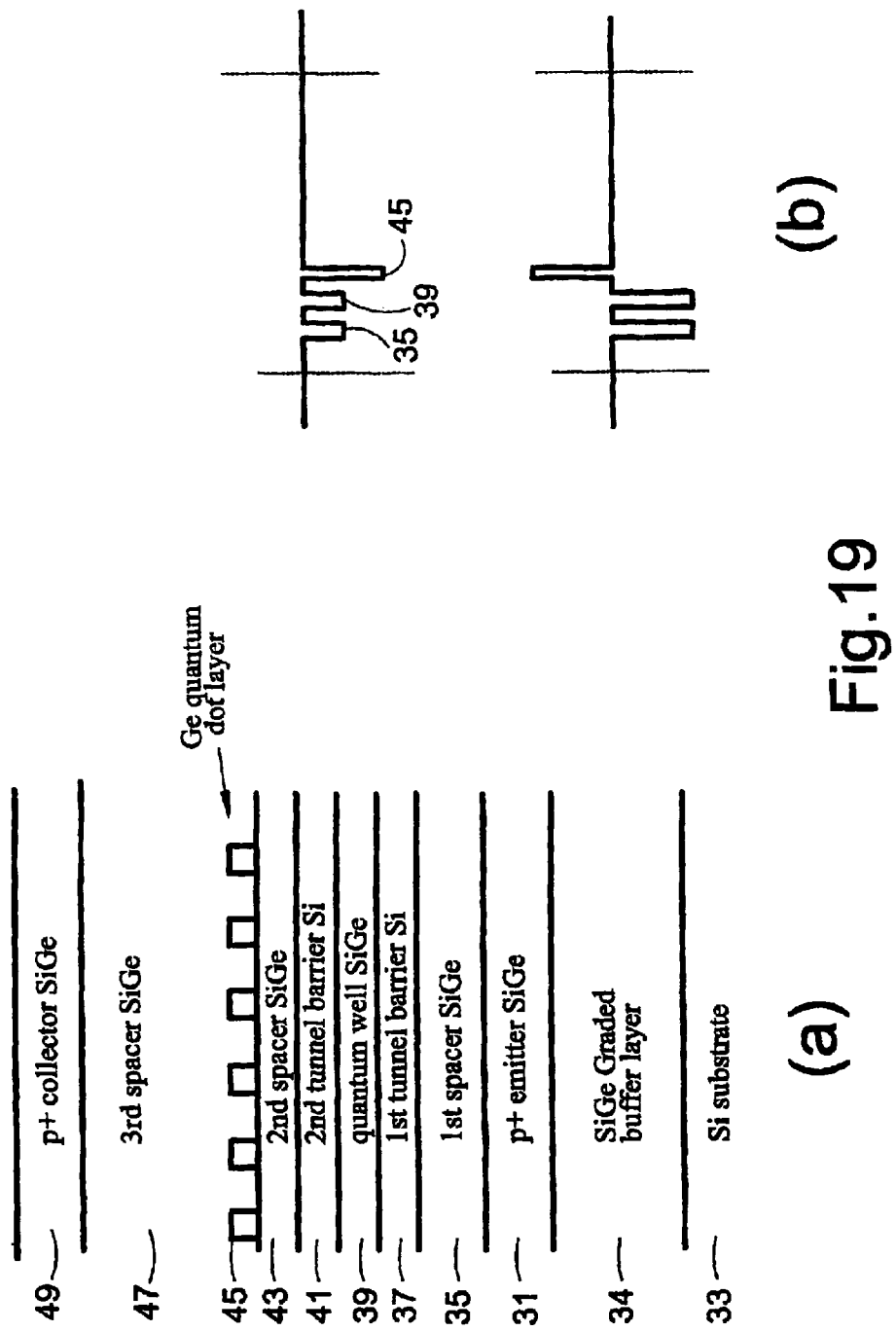

FIG. 19 shows a variation on the layer structure of FIG. 18. A graded buffer layer 34 comprising from 1000 to 2000 nm of $Si_{0.7}Ge_{0.3}$ is formed overlying and in contact with said Si substrate. The buffer layer is graded so that it uniformally changes across its width in the growth direction from having 0 Ge content at the interface with the Si substrate to having a Ge content of 0.3. P+ emitter 31 comprises 500 nm of doped ($2\times10^{18}$ cm$^{-3}$) $Si_{0.7}Ge_{0.3}$. A first spacer layer comprising 50 nm of undoped SiGe is then formed overlying and in contact with said emitter layer 31. A first tunnel barrier layer 37 comprising 8 nm Si is then formed overlying and in contact with said first spacer layer 35. Due to the variations in the band gap between the first spacer layer 35 and the first tunnel barrier layer 37, a quantum well is formed at the heterojunction between the first spacer layer 35 and the first tunnel barrier 37.

A quantum well layer 39 comprising 5 nm of undoped $Si_{0.7}Ge_{0.3}$ is then formed overlying and in contact with said first barrier layer 37. A second barrier layer 41 comprising 8 nm of undoped Si is then formed overlying and in contact with said first quantum well layer 39. A second spacer layer comprising 5 nm of undoped SiGe is then formed overlying and in contact with second tunnel barrier layer 41. A quantum dot layer is then formed from depositing several monolayers of Ge. A third spacer layer 47 comprising 2000 nm of $Si_{0.7}Ge_{0.3}$ is then formed overlying and in contact with said quantum dot layer 45 to encapsulate the quantum dots. A collector comprising 100 nm of p doped ($2\times10^{18}$ cm$^{-3}$) $S_{0.7}Ge_{0.3}$ is then formed overlying and in contact with said third spacer layer.

All of the layer structures described with reference to FIGS. 13 to 19 can be processed as described with reference to FIG. 7.

Figure 20:
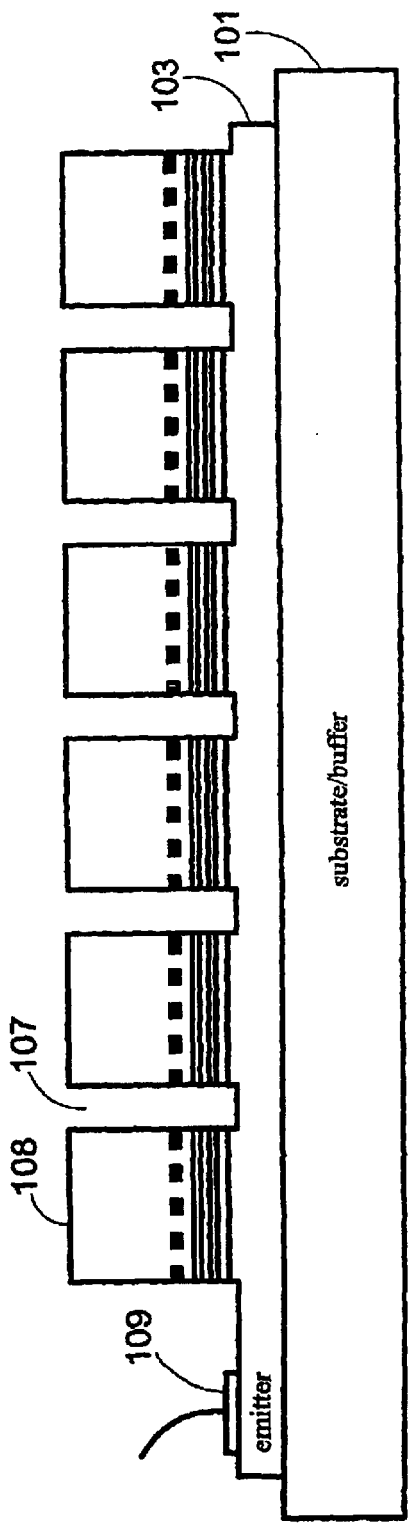
FIG. 20 shows a pixelated device in accordance with an embodiment of the present invention.

FIG. 20 shows a pixelated device made out of a plurality of photon detectors of the type described with reference to FIGS. 1 to 19. The device shown here is similar in structure to that described with reference to FIGS. 6 and 7. However, it will be appreciated by those skilled in the art that the variations shown in FIGS. 8 to 12 could also be employed here.

The device has a mesa which is defined such that a plurality of elements 20 are formed. The elements are formed on a common substrate 101 and a common emitter layer 103. Each element has preferably an upper area of at most $10^{-10}$ m² if the device is to be used as a single photon detector.

The photon detector array is formed on top of a substrate/buffer 101. The substrate/buffer can be any of those described with reference to FIGS. 6 to 19. An emitter layer 103 is then formed overlying and in contact with said substrate/buffer layer 101. The following layers can then be the same as any those described with reference to FIGS. 6 or 8 to 19. The layers are then etched down to the emitter to form a plurality of elements 105, each element being separated by a trench 107 (formed by a mesa etch).

FIG. 20 shows a cross section through the array for simplicity. The array can be a one dimensional array, where the elements 108 continuously extend perpendicular to the plane of the paper. This configuration is useful for a grating spectrometer, where light can be dispersed along a direction perpendicular to the strips so that each strip/element detects a different wavelength.

Alternatively, the elements can form a 2D array of pixels.

The emitter layer 103 is common to each of the elements 105. The emitter layer also extends away from the elements to form the room for emitter contact 109.

Each photon detector element can be switched on by applying an appropriate collector/emitter bias. The bias can be chosen either to align the first and second energy levels when the dots are uncharged or it can be chosen so that the first and second energy levels will align when a quantum dot is charged.

Connecting to the collector is difficult if the elements are small. In such situations, contact metal will be evaporated over the etched structure such that electrical contact can be made to the collector remote from the element 105.

Taking, for example, the situation where the collector/emitter bias aligns the first and second energy levels when the dots are in an uncharged state, when one of the elements 105 absorbs a single photon, current flow through that element is largely suppressed. If individual contact is made to each element, then it is possible to determine the exact element which has absorbed the photon.

Figure 21:
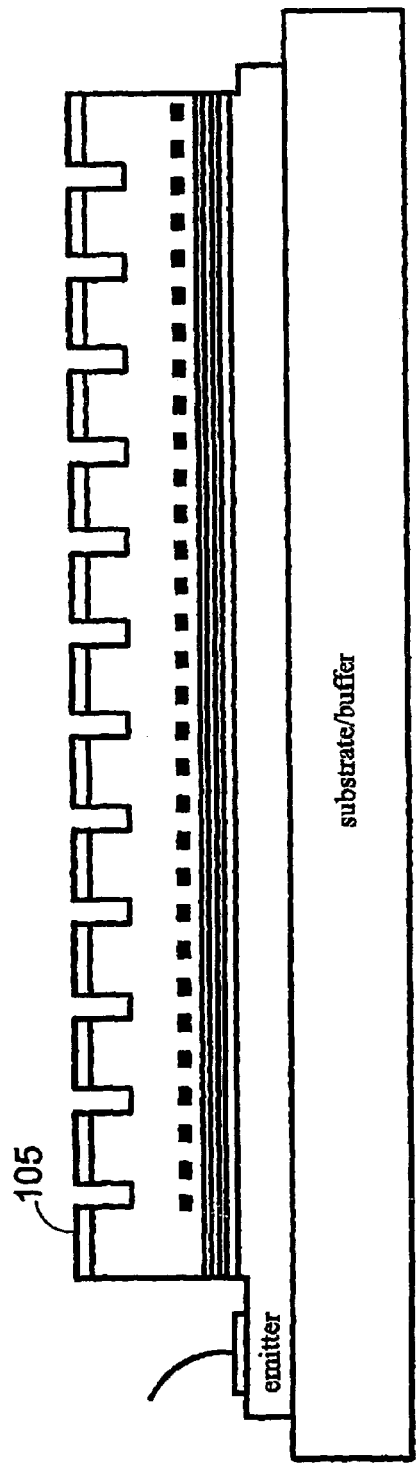
FIG. 21 shows a further variation on a pixelated device in accordance with an embodiment of the present invention having a common emitter.

FIG. 21 shows a variation on the device of FIG. 20. Here, the mesa etch which defines trench 107 just extends into the absorption layer. This shallow etch allows separate elements to be formed. Also, as the etch can cause defects which affect the tunnelling characteristics of the device, it can be advantageous to avoid etching the tunnelling region.

Figure 22:
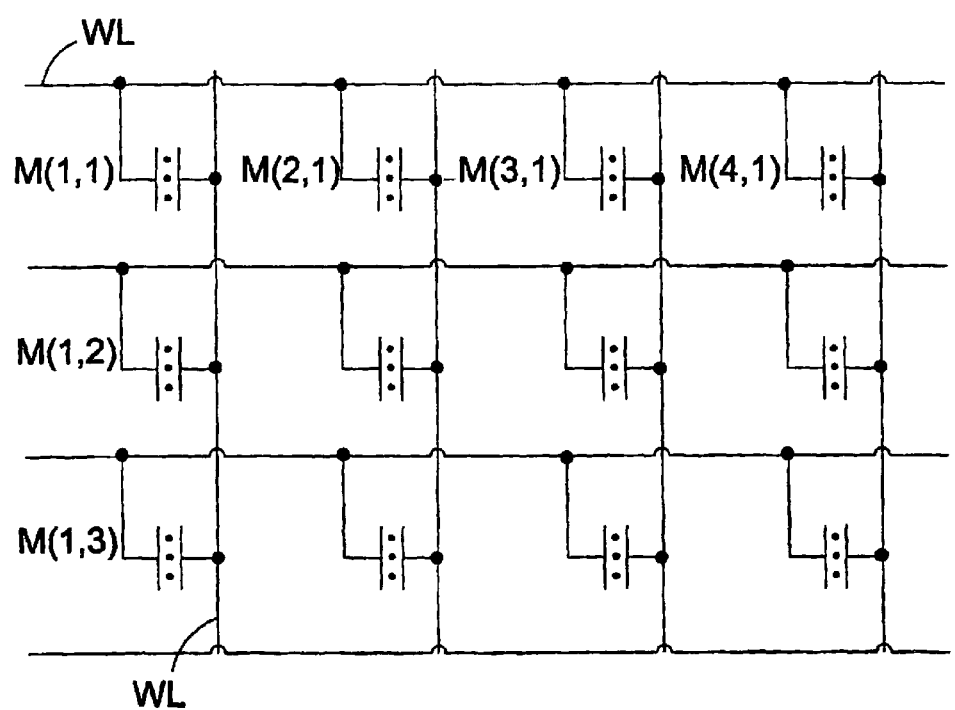
FIG. 22 shows a schematic memory device in accordance with an embodiment of the present invention.

The photon detector can also be configured as a memory device. In a write mode, the elements 105 which are to be written to have a collector/emitter bias applied to them which will allow a carrier to be swept into or out of the dot, as required The device can be illuminated with a broad beam of radiation as only the elements with the correct applied voltage will have the charging state of the quantum dot changed i.e. those elements in an "active" state. The device can then be read by applying an appropriate collector/emitter bias to each of the elements. The collector/emitter bias can be chosen so that elements which have uncharged dots conduct and elements which have charged dots do not or vice versa FIG. 22 shows a schematic device configured as a memory structure. The memory elements M (x,y) each contain a photon detector as previously described. The structure comprises a grid of parallel word lines (WL) which are perpendicular to bit lines (BL). The word lines are in this example connected to the emitter, (they could be connected to the collector) and the bit lines are connected to the collector. By applying a specific bias on a particular word line and a bit line, a potential difference can be applied across the collector and emitter of a selected memory cell M (X,Y).

More than one memory cell can be selected if required.

During a write operation, appropriate voltages are applied on the bit-lines and word-lines to activate the selected memory cells so that photo-excited carriers are trapped within the dots. The device can be configured such that when the power to the word-lines and bit-lines is disconnected, the dots still trap charge. This means that the memory can act as a non-volatile memory. In this situation, it is preferable if the detector is configured such that it is on resonance prior to illumination. Thus, there is little chance of the device resetting itself when the tunnel current flows.

To read the memory, current through the bit lines and word lines are sensed using a current sensing means. The current through an element will change dependent on the tunnelling conditions. By measuring the current passing along the word line and bit line to which a specific element is connected, it is possible to determine the current through the element and hence, the charging state of the dot or dots.

A further type of memory device is also possible using the same principles as above. The wavelength of radiation absorbed by a quantum dot is dependent on the size of the dot and its composition. It is possible to fabricate a memory array where each element comprises a plurality of first quantum dots and where the first quantum dots are of different sizes such that different dots absorb light of different wavelengths. Thus, an optically addressable as well as a spatially addressable memory can be formed.

FIG. 23a shows a cross-section of the device of FIG. 23b. FIG. 23a has a similar layer structure to that of FIG. 20.

The plan view 23b shows a plurality of parallel lines which are emitters 121. These may be formed by growing a heavily doped layer and etching the layer to form strips. The remaining layers will then be formed overlying the emitter in a manner described with reference to any of the preceding figures. The collector will be formed as a heavily doped layer overlying the whole structure. The collector is then etched to form strips 123. Each pixel is defined by the overlap of emitters 121 and collectors 123. The emitters can function as word-lines whereas the collectors can function as bit-lines or vice versa.

Previously, we have discussed the use of bit-lines and word-lines to address each pixel where the collector or emitter is connected to the word-line and the remaining electrode is connected to the bit-line. However, it is also possible to fabricate the device by providing a line of elements all in series with a word-line and a perpendicular line of elements all in series with a bit-line. This will also allow a change in current or the current from a particular element to be monitored. A current sensing circuit can be provided in series with each word-line and each bit-line.

Although the above discussion of pixelated devices has primarily concentrated on memory devices, it is also possible to use such an arrangement for an array of photon detectors. An active area of a photon detector array can be defined by setting all of the elements in that part of the array to an "active" state via an appropriate bias on the selected word-lines and bit-lines. Current sensors are provided on said bit-lines and word-lines. When a photon is absorbed by a single element, a current change will be sensed on the bit-line and word-line which are connected to that element. Thus, such an array can be used to detect photons and to determine the exact point of photon absorption.

What is claimed is:

1. An optical device comprising:
   a barrier region provided between first and second active regions, and configured to allow tunnelling of carriers from the first region to the second region through the barrier region;
   at least one first quantum dot configured such that a change in the charging state of the first quantum dot causes a change in conditions for the tunnelling of carriers through the barrier region; and
   means for changing the charging state of said first quantum dot in response to irradiation.

2. The optical device of claim 1, wherein the first active region is configured to allow the flow of carriers therethrough at a first energy level, the second active layer is configured to allow the flow of carriers therethrough at a second energy level, and wherein a change in the charging state of the first quantum dot causes a change in the relative energies of the first and second energy levels.

3. The optical device of claim 2, wherein said first and second energy levels can be aligned to allow resonant tunnelling through the barrier region.

4. The optical device of claims 3, comprising an emitter and a collector located on either side of said barrier region, the detector being configured such that carriers flow from the emitter to the collector when the first and second energy levels are aligned.

5. The optical device of claim 1, wherein the means for changing the charging state of said first quantum dot are provided by the collector and the emitter.

6. The optical device of claim 1, wherein the means for changing the charging state of the first quantum dot comprises means for separating a photo-excited electron-hole pair and for sweeping at least one of said electron or hole into the first quantum dot.

7. The optical device of claim 6, further comprising an absorption region, wherein radiation absorbed by the absorption region excites an electron-hole pair in the absorption region.

8. The optical device of claim 1, wherein the first quantum dot is configured such that incident radiation excites a transition within said first quantum dot, and said means for changing the charging state of said first quantum dot is configured to sweep a photo-excited carrier out of said first quantum dot.

9. The optical device of claim 8, wherein the first quantum dot is configured such that incident radiation excites an electron-hole pair within the first quantum dot.

10. The optical device of claim 8, wherein the first quantum dot is configured such that incident radiation causes an intraband transition within said first quantum dot.

11. The optical device of claim 1, wherein the first active region is configured to support a two dimensional confinement of the carriers.

12. The optical device of claim 2, wherein the first active region comprises a quantum dot configured to define the first energy level.

13. The optical device of claim 12, wherein the quantum dot configured to define the first energy level is a first quantum dot.

14. The optical device of claim 1, wherein the first active region comprises a bulk three dimensional system.

15. The optical device of claim 1, wherein the second active region is a quantum well configured to support a two dimensional carrier gas.

16. The optical device of claim 2, wherein the second active region comprises a second quantum dot configured to define the second energy level.

17. The optical device of claim 1, further comprising a second barrier region, said second barrier region being located on an opposing side of the second active region with respect to the first barrier region, the second barrier region being configured such that alignment of the first and second energy levels allows tunnelling of carriers through of the second barrier region in addition to the first barrier region.

18. The optical device of claim 1, further comprising a plurality of layers, each layer comprising a plurality of first quantum dots.

19. The optical device 18, wherein the first quantum dots are of different sizes.

20. The optical device of claim 1, wherein the optical device comprises at most 1000 first quantum dots.

21. The optical device of claim 7, wherein the absorption region comprises Iridium.

22. The optical device of claim 7, further comprising a substrate which has a substantially different lattice constant to that of the absorption region.

23. The optical device according to claim 7, further comprising strain reducing means for reducing the strain in an active region due to a lattice mismatch between an active region and the substrate.

24. A photon detector array comprising:
   a plurality of optical elements, each optical element comprising an optical device including,
   a barrier region provided between first and second active regions, and configured to allow tunnelling of carriers from the first region to the second region through the barrier region,
   at least one first quantum dot configured such that a change in the charging state of the first quantum dot causes a change in the conditions for the tunneling of carriers through the barrier region, and
   means for changing the charging state of said first quantum dot in response to irradiation.

25. The photon detector array of claim 24, further comprising a grid of bit-lines and word-lines, wherein an element is addressable by applying an appropriate bias to a word-line and/or bit-line, and wherein one of said word lines or said bit lines is configured to apply a collector bias and the other of said word lines or bit lines is configured to apply an emitter bias.

26. The photon detector of claim 24, wherein each optical element comprises a plurality of first quantum dots, and at least one first quantum dot in at least one of the optical elements is configured to absorb radiation at a different wavelength than at least one other first quantum dot in the same optical element.

27. The memory structure of claim 1, wherein the first quantum dots of each optical element are configured to maintain their charging state even when the power to the bit lines and word line is switched off.

28. The memory structure of claim 1, wherein at least one optical element comprises a plurality of first quantum dots, and wherein at least one first quantum dot in the at least one optical element is configured to absorb radiation with a different wavelength to that of at least one other first quantum dot within the same optical element.

29. An optical device comprising:
   a barrier region provided between first and second active regions, and configured to allow tunnelling of carriers from the first region to the second region through the barrier region; and
   optically activated means for varying conditions for the tunnelling of carriers through the barrier region in response to irradiation.

30. A method of fabricating an optical device comprising:

forming a barrier region between first and second active regions, the barrier region configured to allow tunnelling of carriers from the first region to the second region through the barrier region;

forming at least one first quantum dot as part of a layer comprising a plurality of quantum dots, the first quantum dot configured such that a change in the charging state of the first quantum dot causes a change the conditions for the tunnelling of carriers through the barrier region; and forming means for changing the charging state of said first quantum dot in response to irradiation;

forming at most 10 monolayers of a quantum dot layer overlying and in contact with a first layer having a substantially different lattice constant to that of the quantum dot layer, such that the quantum dot layer forms islands; and forming a second layer overlying said quantum dot layer and having a substantially different lattice constant to that of the quantum dot layer, such that a plurality of encapsulated quantum dots are formed.

31. An optical device comprising:

a barrier region provided between first and second active regions and configured to allow tunneling of carriers from the first region to the second region through the barrier region;

at least one quantum dot configured such that a change in the charging state of the quantum dot causes a change in the conditions for the tunneling of carriers through the barrier region;

an absorption regions configured to absorb radiation and to thereby excite an electron-hole pair; and means for changing the charging state of said quantum dot in response to irradiation, the means for changing the charging state including means for separating a photo-excited electron-hole pair, from the absorption region, and means for sweeping at least one of an electron or hole of the separated electron-hole pair into the quantum dot.

32. An optical device comprising:

a barrier region provided between first and second active regions and configured to allow tunneling of carriers from the first region to the second region through the barrier region;

at least one quantum dot configured such that a change in the charging state of the quantum dot causes a change in the conditions for tunneling through the barrier region; and means for changing the charging state of said quantum dot in response to irradiation, wherein the quantum dot is configured such that incident radiation excites a transition within said quantum dot, said means for changing the charging state of said quantum dot is configured to sweep a photo-excited carrier out of said quantum dot.

33. An optical device comprising:

a barrier region provided between first and second active regions and configured to allow tunnelling of carriers from the first region to the second region;

at least one quantum dot configured such that a change in the charging state of the quantum dot causes a change in conditions for the tunnelling of carriers through the barrier region, the charging state of the quantum dot changing in response to irradiation.

34. The optical device of claim 33, further comprising an absorption region configured to absorb the irradiation and thereby photo-excite an electron-hole pair, wherein the charging state of the quantum dot changes in response to separation of the photo-excited electron-hole pair.

35. The optical device of claim 34, wherein the charging state of the quantum dot changes in response to either of an electron or hole of the separated electron-hole pair being swept into the quantum dot.

36. The optical device of claim 33, wherein the charging state of the quantum dot changes in response to absorption of a photon by the quantum dot.

* * * * *